United States Patent [19]

Fujimaki

[11] Patent Number: 5,162,731
[45] Date of Patent: Nov. 10, 1992

[54] SUPERCONDUCTING QUANTUM INTERFERENCE MAGNOTOMETER HAVING A FEEDBACK RESET CAPABILITY TO EXTEND THE DYNAMIC SENSING RANGE

[75] Inventor: Norio Fujimaki, Atsugi, Japan

[73] Assignee: Fujitsu Limited, Kawasaki, Japan

[21] Appl. No.: 633,339

[22] Filed: Dec. 26, 1990

[30] Foreign Application Priority Data

Dec. 26, 1989 [JP] Japan .................................. 1-340965

[51] Int. Cl.⁵ .......................................... G01K 33/035
[52] U.S. Cl. .................................... 324/248; 338/325; 505/846
[58] Field of Search ............................... 324/248, 244; 505/841–846; 338/325; 307/306

[56] References Cited

U.S. PATENT DOCUMENTS

| | | | |
|---|---|---|---|
| 3,667,033 | 5/1972 | Davis | 324/248 |
| 4,489,274 | 12/1984 | Berlincourt | 324/248 |
| 4,549,135 | 10/1985 | Vaidya | 324/248 |
| 4,663,590 | 5/1987 | Gershenson et al. | 324/248 |
| 4,947,118 | 8/1990 | Fujimaki | 324/248 |

FOREIGN PATENT DOCUMENTS

1-185464  7/1989  Japan .................................. 324/248

Primary Examiner—Kenneth A. Wieder
Assistant Examiner—Warren S. Edmonds
Attorney, Agent, or Firm—Staas & Halsey

[57] ABSTRACT

A superconducting pickup coil is provided for interlinking with an unknown magnetic flux and causing an induction current to flow. A superconducting detector is provided magnetically coupled with the superconducting pickup coil for producing output voltage pulses in response to the unknown magnetic flux. A superconducting feedback circuit is provided connected to the superconducting detector for receiving the output voltage pulses therefrom and feeding back a feedback magnetic flux to the superconducting pickup coil in response to each output voltage pulse such that the feedback magnetic flux counteracts the unknown magnetic flux. A resistance fixture is provided in the vicinity of the superconducting pickup coil for causing a transition in a part of the superconducting pickup coil from a superconducting state to a normal conducting state in response to the drive current. A controller is provided connected to the resistance fixture and the superconducting detector for receiving the output pulses therefrom and producing a drive current for energizing the resistance fixture. Simultaneously with the energization of the resistance fixture, the controller resets the feedback circuit such that the counteracting feedback magnetic flux is deenergized.

9 Claims, 18 Drawing Sheets

FIG.2
*PRIOR ART*
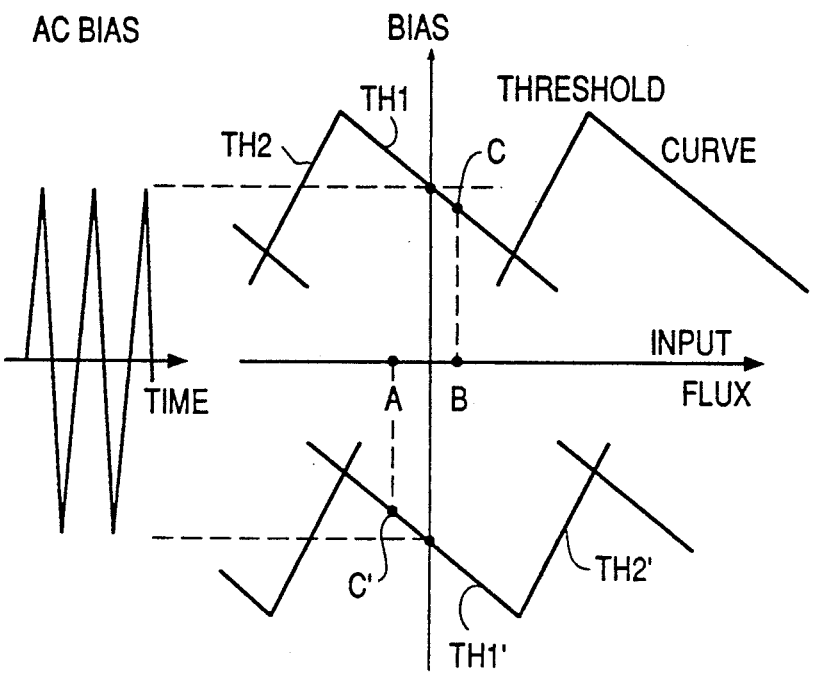
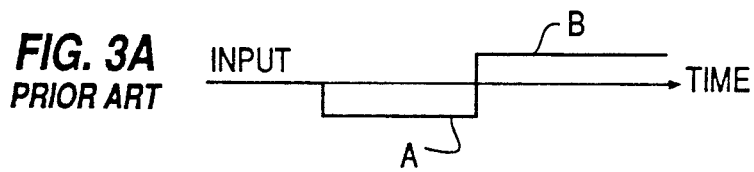
FIG. 3A
*PRIOR ART*
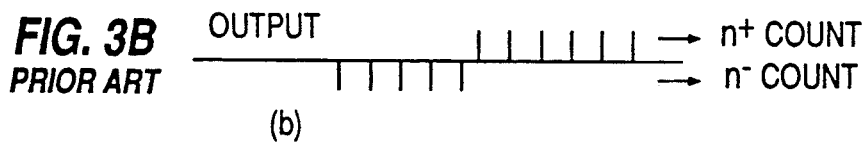
FIG. 3B
*PRIOR ART*
(b)
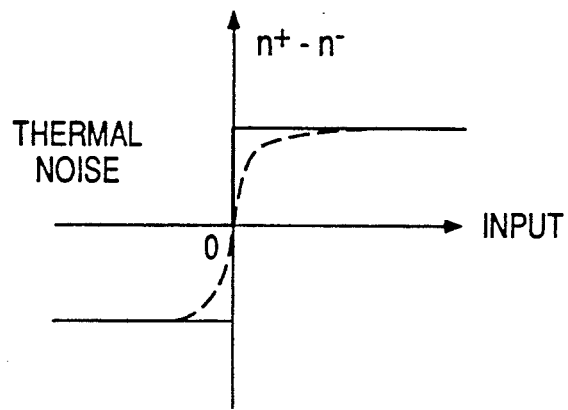
FIG. 3C
*PRIOR ART*

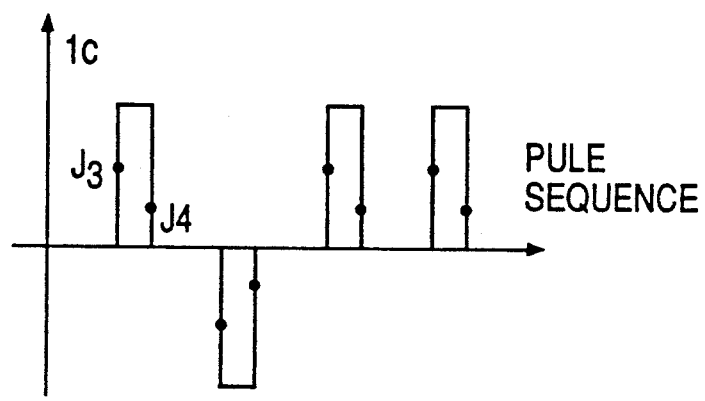
FIG. 5A
*PRIOR ART*
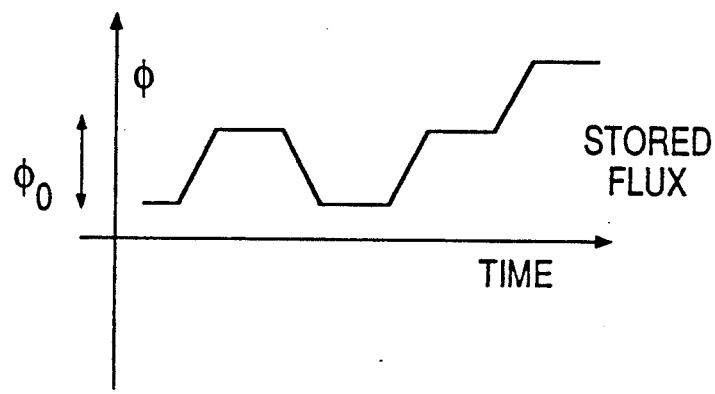
FIG. 5B
*PRIOR ART*
FIG. 7
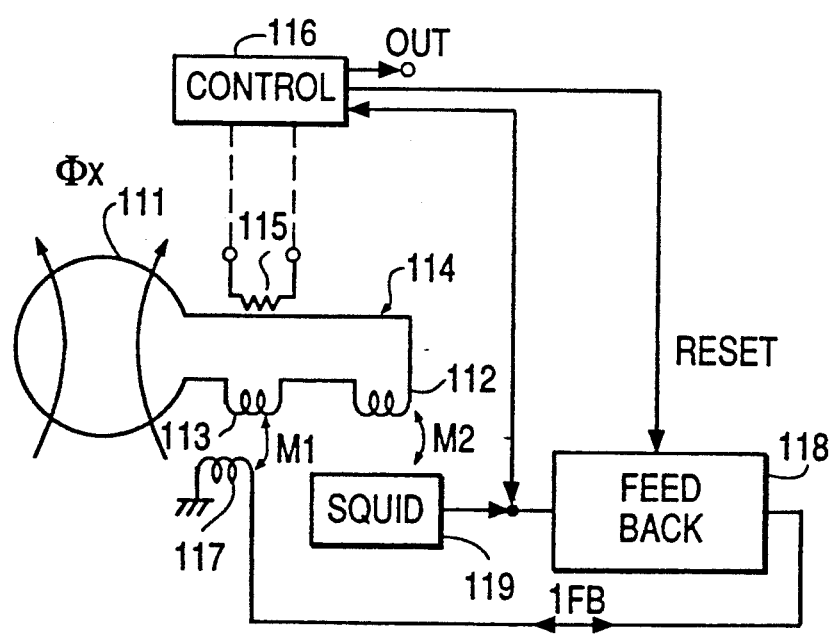

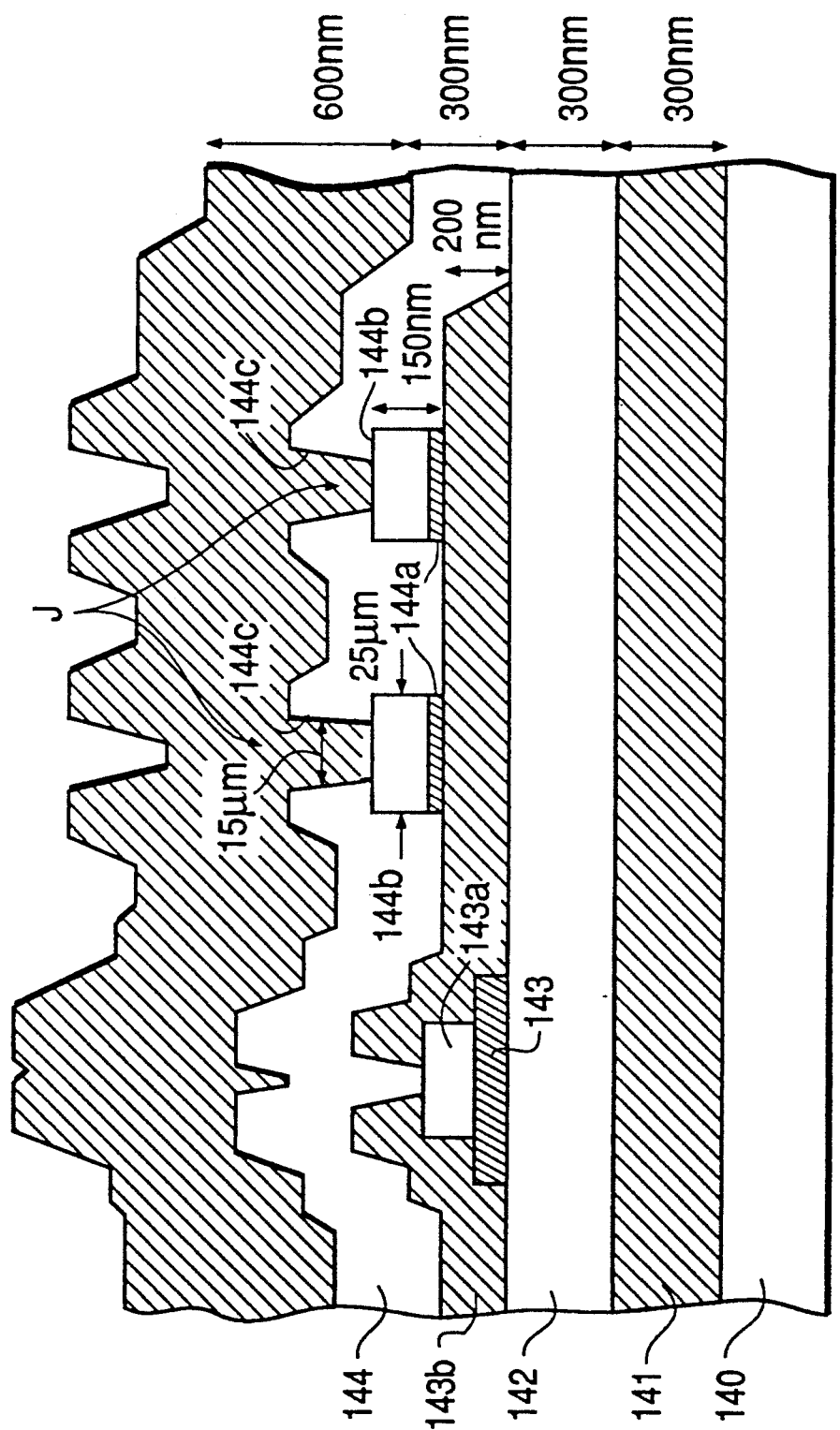

FIG. 17
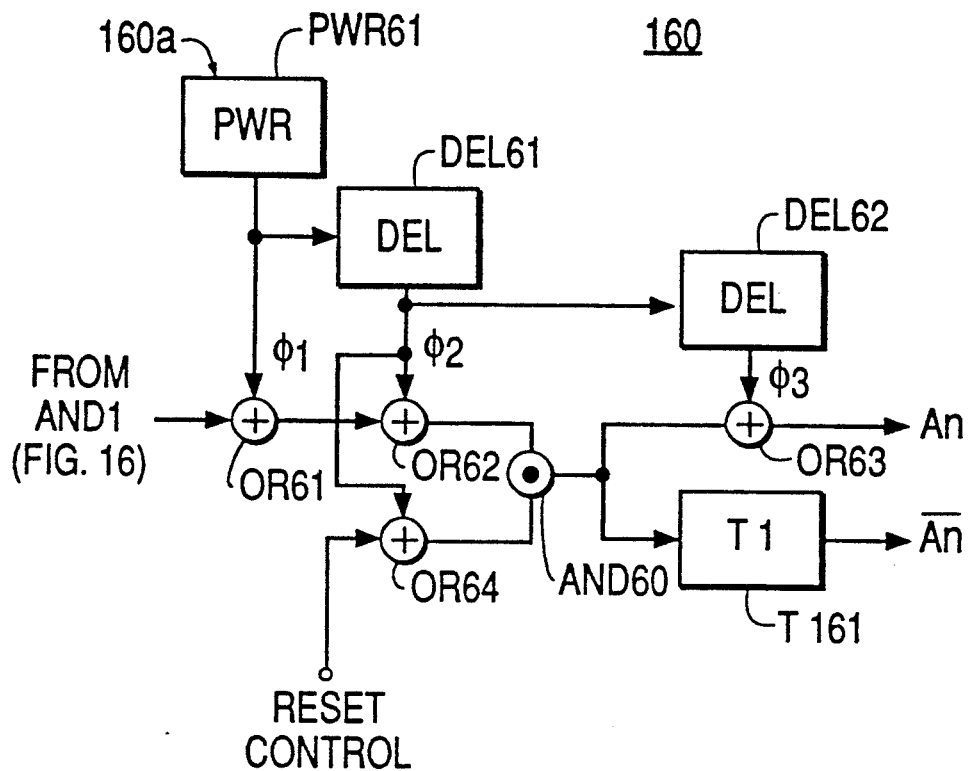
FIG. 18A  φ1  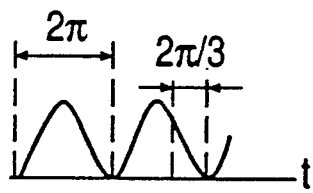
FIG. 18B  φ2 2π/3  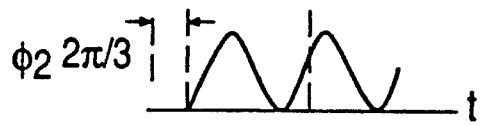
FIG. 18C  φ3 2π/3  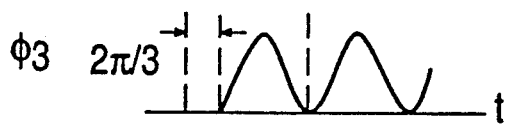

SUPERCONDUCTING QUANTUM INTERFERENCE MAGNOTOMETER HAVING A FEEDBACK RESET CAPABILITY TO EXTEND THE DYNAMIC SENSING RANGE

BACKGROUND OF THE INVENTION

The present invention generally relates to superconducting circuits and more particularly to a superconducting quantum interference device having an extended dynamic range for measurement of magnetic field.

Conventionally, various magnetometers have been employed for the measurement of weak magnetic fields. Such magnetometers include Hall-effect devices, flux gate devices, and superconducting quantum interference devices. Among others, the superconducting quantum interference magnetometers using the superconducting quantum interference device (abbreviated hereinafter as SQUID) for the magnetic field detection are capable of measuring extremely feeble magnetic fields (less than $10^{-10}$T) and find applications in various fields such as biomagnetic measurements, detection of gravitational radiations, and various geophysical applications.

Conventionally, the SQUID magnetometer comprises a SQUID sensor for detecting the magnetic field and a feedback loop for measuring the magnitude of the detected magnetic field. The SQUID sensor may be a d.c. biased device as disclosed by Ketchen (Ketchen, M. B. "Integrated Thin Film, DC SQUID Sensors," IEEE Trans. Magn., vol.MAF-23, no. 2, pp. 1068–1071, 1987.) or a d.c. biased device with Josephson comparator which produces pulse that depends on an analog output of the d.c. biased device as disclosed by Drung (Drung, G., "Digital Feedback Loops for d.c. SQUIDs," Cryogenics, vol. 26, pp. 623–627, 1986), and used in combination with an external feedback circuit that measures the magnitude of the detected magnetic field. As the SQUID magnetometer employs the SQUIDs that operate only at a temperature below the critical temperature of normal conduction-superconduction for the magnetic sensor, the essential part of the magnetometer including the SQUID sensor is always immersed in a cooling medium typically of liquid helium of which boiling temperature is 4.2° K. On the other hand, the bulky external feedback circuit has been provided outside the low temperature system and operated at the room temperature. Because of this, the conventional SQUID magnetometers have suffered from the problem of excessive consumption or evaporation of liquid helium caused by the penetration of heat into the low temperature system through the wiring fixture connecting the SQUIDs and the feedback circuit.

On the other hand, the applicants of the present invention have previously proposed a SQUID magnetometer system wherein the SQUID sensor and the feedback circuit are integrated on a single chip (Fujimaki, N. et al. "A Single-Chip SQUID Magnetometer," IEEE Trans. Electron Devices vol. 35, no. 12, December 1988). This prior art system has an advantageous feature in that the problem of excessive consumption or evaporation of helium due to the penetration of heat is successfully minimized by immersing the entire system in the liquid helium container. Further, this magnetometer produces the output in the form of digital output pulse which is advantageous in view point of increased signal-to-noise ratio and easiness in processing the output data by digital processing systems.

FIG. 1 shows the construction of this SQUID magnetometer proposed previously by the applicants. The magnetometer comprises a pickup coil 1 for detecting a magnetic flux $\Phi_x$ and a superconducting path 4 connected to the pickup coil 1. In the superconducting path 4, there are provided superconducting windings 2 and 3 of which function will be described later, and the pickup coil 1 and the superconducting windings 2 and 3 form a closed superconducting circuit with the superconducting path 4.

In the vicinity of the superconducting winding 2, there is provided another superconducting winding 11 that forms a closed interferometer loop 10 together with Josephson junctions J1 and J2. Thereby, respective first ends of the Josephson junctions J1 and J2 are connected commonly with each other to the superconducting ground plane. On the other hand, respective second ends of the Josephson junctions J1 and J2 are connected to corresponding ends of the winding 11. The winding 11 is so provided to establish a magnetic coupling M2 with the winding 2 in the superconducting path 4. Further, the end of the Josephson junction J1 that is connected to the superconducting winding 11 is connected to a power source 12 that supplies an a.c. drive current to the Josephson junctions J1 and J2. Thereby, the Josephson junctions J1, J2, the superconducting winding 2, and the superconducting winding 11 form a SQUID sensor 9 of which output is obtained at the node connecting the Josephson junction J1 and the winding 11.

The operation of the SQUID sensor 9 is as follows. Upon incidence of a magnetic flux $\Phi_x$ to the pickup coil 1, an induction current flows through the superconducting path 4 which in turn creates a magnetic field at the superconducting winding 2. This magnetic field interacts with the superconducting winding 11 and causes to flow a current through the Josephson junctions J1 and J2. On the other hand, the SQUID sensor 9 has a threshold characteristic as shown in FIG. 2 wherein either or both of the Josephson junctions J1 and J2 experience a transition from the zero-voltage state characterized by the zero voltage against a finite current, to the finite voltage state characterized by a finite voltage against the finite current when the supplied drive current has crossed a threshold level. This threshold level changes with the induction current that flows through the superconducting path 4 and hence with the incident magnetic flux $\Phi_x$, and thereby the threshold level changes according to a threshold characteristic curve as shown in FIG. 2 by TH1, TH2, TH1' and TH2'.

In operation, the SQUID sensor 9 is driven with the a.c. drive current of which magnitude is set nearly the threshold level that is defined with respect to the case where there is no incident magnetic flux $\Phi_x$. Thus when there is no incident magnetic flux, the Josephson junctions J1 and J2 in the interferometer loop 10 remain in the zero-voltage state and no output voltage will appear on the output terminal of the SQUID sensor 9. On the other hand, when there is an input flux $\Phi_x$ as shown in FIG. 3A, the operational point of the SQUID sensor is moved to a point A in FIG. 2 in correspondence to the negative part A of the waveform in FIG. 3A and crosses the threshold curve at a point C' in response to the negative peak of the drive current in the first half cycle of the a.c. drive current. Thereby, the Josephson junction J1 cases a transition to the finite voltage state that is immediately followed by the Josephson junction J2. In response to the transition of the Josephson junctions J1 and J2 thus caused, a negative output voltage appears on the output terminal because of the finite resistance of the interferometer loop 10. Subsequently, the drive current swings back. The Josephson junctions J1 and J2 return to the zero-voltage state again when the drive current decreases less than the point C' due to a large hysteresis of the current-voltage curve of the device. Thereby, the output voltage at the output terminal returns to zero and thus, the output of the SQUID sensor takes the form of a voltage pulse. In the following positive half cycle, the transition to the finite voltage state does not occur, as the threshold level TH1 for this case is shifted in the positive direction and the crossing of the threshold level TH1 by the operating point does not occur even in the peak of the drive current.

In the case when the incident flux $\Phi_x$ has a direction opposite to the foregoing case as shown in the part B of FIG. 3A, on the other hand, the operating point crosses at a point C shown in FIG. 2 near the positive peak of the a.c. drive current. No crossing of the negative threshold level TH1' occurs in this case. Thereby a positive voltage pulse appears on the output terminal.

Thus, the SQUID sensor of FIG. 1 produces a voltage pulse having a polarity that represents the direction or polarity of the incident magnetic flux as shown in FIG. 3B. On the other hand, the output voltage pulse of the SQUID sensor as shown in FIG. 3B does not provide any information about the magnitude of the magnetic flux thus detected. FIG. 3C shows the determination of direction of the detected magnetic flux. In this process, the positive pulses and negative pulses are counted for a predetermined period and the number of negative pulses is subtracted from the number of the positive pulses. Thereby, the difference in the number of positive and negative pulses in a unit time, $n^+ - n^-$, changes with the input as shown by the solid line. However, because of the fluctuation such as the thermal noise, the output pulse changes as shown by the dotted line, reflecting the stochastic process.

FIGS. 4A and 4B show the construction of a superconducting feedback circuit 8 which is integrated on the single chip SQUID magnetometer of FIG. 1 and used in combination with the SQUID sensor for determination of the magnitude of the magnetic flux. The feedback circuit 8 comprises a superconducting winding 23 having a first end connected to the SQUID sensor 9 via a resistor 24 and a second end connected to a first end of another superconducting winding 22 that establishes a magnetic coupling M3 with the winding 23. The superconducting winding 22 has another, second end at the side opposite from the first end, wherein both the first and second ends of the superconducting winding 22 are connected to the superconducting ground plane via respective Josephson junctions J3 and J4. Thereby, the winding 22 and the Josephson junctions J3 and J4 form a superconducting interferometer loop 21 similar to the superconducting interferometer loop 10 of the SQUID sensor 9, except that the winding 22 is directly connected to the winding 23. Further, the foregoing second end of the superconducting winding 23 is connected to a first end of a large superconducting winding 26 of which inductance value may be 10–30 $\mu$H in the typical example. Further, the superconducting winding 26 has a second end that is connected, via a superconducting path, to another superconducting winding 7 that establishes a magnetic coupling M1 with the superconducting winding 3 in the superconducting path 4. Thereby, there is formed a magnetic flux storage loop 27 to be described later by the Josephson junctions J3, J4 and the superconducting windings 22, 23, 26 and 7.

The operation of the feedback circuit 8 is as follows. Referring to FIG. 4A, the output voltage pulse of the SQUID sensor 9 is supplied to the superconducting winding 23 in the form of an input current pulse Ic. This current pulse Ic is divided into a path flowing through the loop 21 and another path flowing through the winding 26, wherein the majority of the current flows through the loop 21 as a current Ig because of the large inductance value of the winding 26. In other words, the current Ig is nearly the same as the magnitude of the current pulse Ic.

FIG. 4B shows the operational characteristic of the feedback circuit 8. Because of the fundamental interferometer construction of the loop 21, the circuit 21 has a threshold characteristic similar to that described with reference to FIG. 2, wherein the threshold lines TH1, TH2, TH1' and TH2' are repeated regularly along the horizontal axis representing the current Ic. Such a repetition of the characteristic is designated in FIG. 4B as MODE0, MODE+1, MODE−1, ..., in which the MODE0 represents the state where there is no flux quantum trapped in the loop 21, the MODE+1 represents the state wherein a single flux quantum having a first direction or polarity is trapped in the loop 21, and the MODE−1 represents the state wherein a single flux quantum having a second, opposite polarity is trapped in the loop 21.

Starting from the MODE0, the current Ig increases with the current pulse Ic in response to the incoming of the output pulse of the SQUID sensor 9, and the operational point moves along a straight line A-B in FIG. 4B. At the beginning, this current Ig mainly flows through the Josephson junction J3 because of the finite inductance value of the winding 22 connected in series to the Josephson junction J4. Thereby, the operational point crosses the threshold level TH1 of the MODE0 at a point J3 on the line A-B and the Josephson junction J3 causes a transition to the finite voltage state in response thereto. Simultaneously to the switching of the Josephson junction J3 thus caused, the path of the current Ig is now changed to flow through the Josephson junction J4. In response to this, the magnetic flux that accompanies the current Ig flowing through the Josephson junction J4 enters into the superconducting interferometer loop 21 at the Josephson junction J3 that is now in the finite voltage state in the form of magnetic flux quantum. In response to the entering of the flux quantum, the mode of the loop 21 changes to the MODE+1 and the Josephson junction J3 returns immediately to the zero-voltage state. It should be noted from FIG. 4B that the point J3 is located within the zero-voltage region of the MODE+1 mode.

Subsequent to the aforementioned process, the magnitude of the current Ic is decreased again in response to the falling edge of the output pulse, and thereby the operational point moves toward the origin O of the graph of FIG. 4B along the line A-B. During this process, the operational point crosses the threshold level TH2 of the MODE+1 at a point J4, and in response thereto, the Josephson junction J4 experiences a momentary transition to the finite voltage state similar to the Josephson junction J3. When this occurs, the flux quantum held in the superconducting loop 21 is transferred to the superconducting winding 26 of the storage loop 27. When a negative voltage pulse arrives from the sensor 9, an essentially same phenomenon occurs with the polarity reversed, along the line O-B. Thereby, a persistent current is induced in the winding 26 and the flux quantum is transferred to the superconducting storage loop 27. Thereby, the magnetic flux in the winding 26 increases or decreases stepwise in response to each entering of the flux quantum. Of course, in the case when the polarity of the flux quantum that is newly transferred to the loop 27 has a polarity that cancels the magnetic flux stored therein, the magnetic flux in the winding 26 is decreased stepwise.

After the transfer of the trapped flux quantum to the flux storage loop 27, the mode of the interferometer 21 returns to the MODE0. Thereby, the Josephson junction J4 returns to the zero-voltage state. It should be noted that the point J4 is located inside the MODE0 region and thus, the Josephson junction J4 should be in the zero-voltage state when the interference loop 21 has returned to the MODE0.

As described heretofore, the superconducting loop 21 forms a functional block 25, together with the superconducting winding 23, that writes a magnetic flux into the superconducting winding 26 of the storage loop 27 in response to the output pulse of the SQUID sensor 9. Because of this reason, the functional block 25, comprising the superconducting windings 22, 23 and 26 as well as the Josephson junctions J3 and J4, is called a "write gate."

FIGS. 5A and 5B show the foregoing sequence of storing the flux quantum in the storage loop 27, wherein the Josephson junction J3 causes the momentary transition from the zero-voltage state to the finite voltage state in response to the leading edge of the current pulse Ic while the Josephson junction J4 causes the momentary transition from the zero-voltage state to the finite voltage state in response to the trailing edge of the current pulse Ic. In response to the each transition of the Josephson junction J3 that is followed by a corresponding transition of the Josephson junction J4, a magnetic flux $\Phi_O$ corresponding to the foregoing flux quantum is added in the superconducting winding 26 of the storage loop 27, and the magnetic flux $\Phi$ stored by the superconducting winding 26 is increased or decreased stepwise as shown in FIG. 5B.

It should be noted that the flux storage loop 27 is coupled to the superconducting path 4 at the windings 3 and 7. Thereby, the persisting current in the loop 27 corresponding to the stored magnetic flux flows through the winding 7 as a feedback current IFB and the magnetic flux $\Phi_x$ is canceled out by the magnetic flux $\Phi$ step by step with increasing magnetic flux in the storage loop 27 until it disappears entirely. During this process, the output pulse of the SQUID sensor 9 is counted up by an external counting circuit and the number of counts thus obtained represents the magnitude of the incident magnetic flux $\Phi_x$.

In this conventional SQUID magnetometer, there exists a problem in that the magnetic flux that can be stored in the storage loop 27 is limited even though the superconducting winding 26 is designed to have a large inductance. As a matter of fact, the dynamic range of the SQUID magnetometer of the foregoing prior art has been limited in the order of $10^5$ in terms of the number of flux quanta that corresponds to the magnetic flux the storage loop 27 can store.

FIG. 6 is a diagram for explaining the cause of this undesirable result.

It should be noted that each time a flux quantum is transferred to the storage loop 27, a minute persistent current flows through the loop 27. As will be understood from FIG. 4A, this persistent current contributes to the current Ig. Thus, the current Ig does not return to zero exactly once the magnetic flux corresponding to the flux quantum is entered to the storage loop 27, even when the current Ic is returned to zero thereafter. Although the magnitude of the persistent current per one flux quantum is small in view of the large inductance of the superconducting winding 26, the effect of this persistent current nevertheless becomes appreciable when a large number of flux quanta are transferred to the storage loop 27. It should be noted that it is exactly this current Ig that induces the counteracting magnetic field at the winding 7.

When this occurs, the origin O of FIG. 4B will shift in the upward or downward direction to a new origin O' or O'' along the vertical axis as shown in FIG. 6, and the operational line O-A or O-B on which the operational point moves experience a corresponding shift in the downward direction or in the upward direction to a new line O'-A' or O''-B'. When the magnitude of the magnetic flux $\Phi_x$ under investigation is large, the line O'-A' may ultimately cross a point C defined in FIG. 6 as an intersection of the threshold line TH2 and the threshold line TH1' of the MODE+1. When this occurs, the operational point moving along the new line O'-A' in response to the current Ic will cross the threshold TH1' of the MODE+1 instead of the threshold TH2 thereof. Thus, when the operational point returns after crossing the threshold TH1 of the MODE0 and causing thereby the transition of the Josephson junction J3 that eventually causes the transition of the mode from the MODE0 to the MODE+1, the Josephson junction J3, not the Josephson junction J4, will cause the momentary transition to the finite voltage state upon the crossing of the operational point through the threshold TH1' of the MODE+1. In other words, the transition of the Josephson junction J4 will not occur in this process and the flux quantum that has entered into the loop 21 through the transition of the Josephson junction J3 may exit therefrom upon the transition of the Josephson junction J3 made after the first transition. Thereby, no storage of new flux quantum occurs anymore.

An exactly the same situation occurs also in the case where the line O-B has shifted in the upward direction to the line O''-B' that locates above a point D where the threshold line TH1 and the threshold line TH2' of the MODE−1 crosses. Thus, the conventional SQUID magnetometer of FIG. 1 suffers from a problem of limited dynamic range that the magnetometer is operational.

SUMMARY OF THE INVENTION

Accordingly, it is a general object of the present invention to provide a novel and useful SQUID magnetometer wherein the foregoing problems are eliminated.

Another and more specific object of the present invention is to provide a SQUID magnetometer having an extended dynamic range for magnetic field measurements.

Another object of the present invention is to provide a SQUID magnetometer comprising a superconducting pickup coil for detecting a magnetic field, a SQUID sensor coupled magnetically to the superconducting pickup coil for producing a series of output voltage pulses in response to the magnetic field detected by the superconducting pickup coil, a feedback circuit supplied with the output voltage pulses of the SQUID sensor and coupled magnetically to the superconducting pickup coil for inducing a counteracting magnetic field therein of which strength is controlled stepwise in response to each of the output voltage pulses, interruption means for interrupting passage of an induction current through the superconducting pickup coil, and control means supplied with the output voltage pulses from the SQUID sensor for energizing said interruption means and resetting the feedback circuit each time when the number of output pulses received from the SQUID sensor has exceeded a predetermined threshold such that a feedback current that has been produced by the feedback circuit and sustains the counteracting magnetic field is cleared. According to the present invention, the problem of unwanted saturation of the superconducting storage loop in the feedback circuit by the magnetic flux stored therein in response to the excessive number of output pulses of the SQUID sensor, is successfully eliminated by interrupting the induction current that flows through the pickup coil in response to the incident magnetic flux. Such an interruption of the induction current is achieved by the interruption means that causes a transition, from the superconduction state to the normal conduction state, in a part of the pickup coil, and thereby the magnetic field $\Phi_x$ under investigation is incorporated into the region of the pickup coil that experienced the transition from the superconduction state to the normal conduction state. After a subsequent cooling that causes the transition back to the superconduction state, the incident magnetic flux $\Phi_x$ is trapped in the pickup coil in the form of a flux quantum. As such a flux quantum in the superconducting body does not accompany the corresponding induction current, the magnetic flux $\Phi_x$ is counteracted by the trapped flux quanta without supplying the feedback current for creating the counteracting magnetic field from feedback circuit. At the same time to the energization of the interruption means, the control means controls the feedback circuit to clear the feedback current that sustains the magnetic flux $\Phi$ stored in the storage loop. In other words, the feedback current is resetted to zero, and the measurement of the magnetic field is restarted again using the output pulses of the SQUID sensor just the same manner as in the case where the magnetic field measurement is started. Thereby, any change in the incident magnetic flux $\Phi_x$ that has occurred since the foregoing resetting of the measurement range is measured and the magnitude of the magnetic flux thus measured is added to the magnitude of the flux measured previously, prior to the resetting. By repeating the foregoing processes, the magnetic field of arbitrary strength can be measured without being restrained from the limited dynamic range of the SQUID magnetometer.

Other objects and further features of the present invention will become apparent from the following detailed description when read in conjunction with the attached drawings.

BRIEF DESCRIPTION OF THE DRAWINGS

FIGS. 2 and 3A-3C are diagrams for explaining the operation of a SQUID sensor used in the SQUID magnetometer of FIG. 1;

FIGS. 4A-4B and FIGS. 5A-5B are diagrams for explaining the operation of a feedback circuit used in the SQUID magnetometer of FIG. 1;

FIG. 7 is a block diagram showing the general construction of the essential part of a first embodiment SQUID magnetometer according to the present invention;

FIG. 12 is a cross-sectional view showing the construction of the SQUID sensor used in the SQUID magnetometer of FIG. 7 wherein the heating fixture is incorporated;

FIG. 17 is a circuit diagram showing the construction of the latch circuit used in the circuit of FIG. 16;

FIGS. 18A-18C are diagrams showing the waveform of the three-phase drive currents used in the circuit of FIG. 17;

DETAILED DESCRIPTION

Hereinafter, a first embodiment of the present invention will be described with reference to FIG. 7 showing the general construction of the system.

Figure 1:
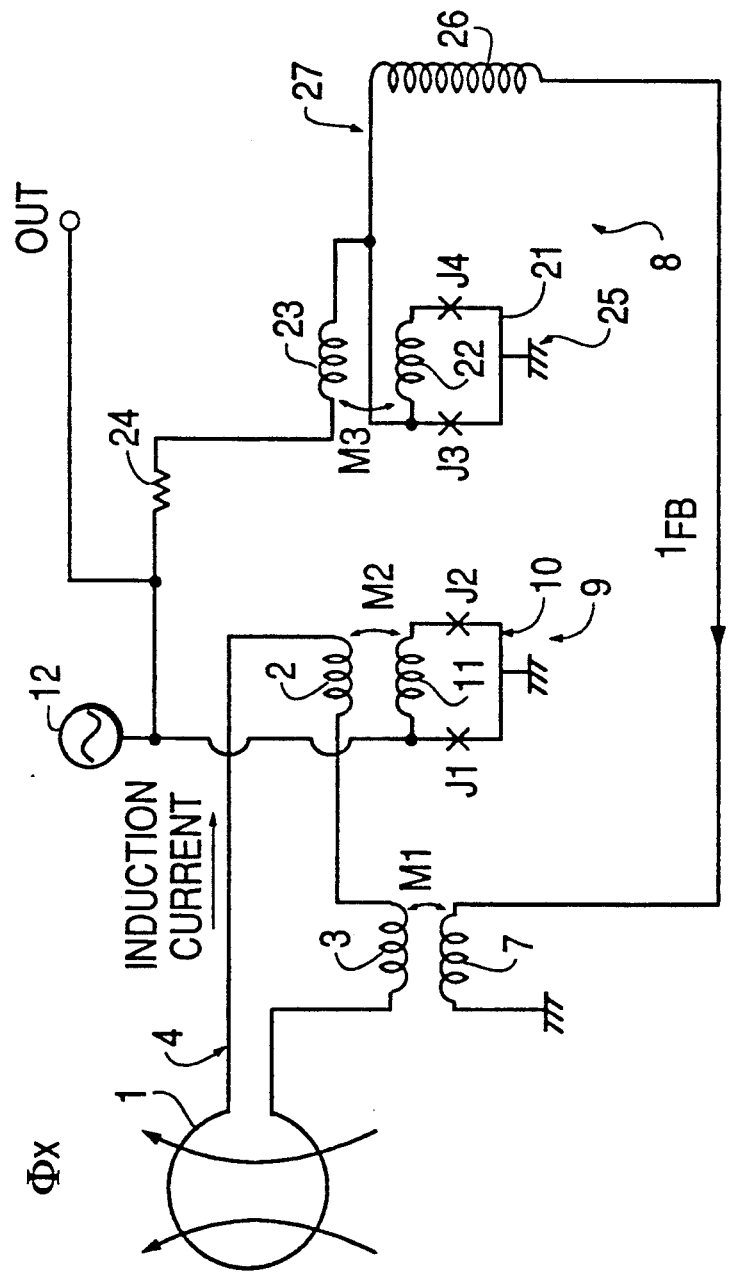
FIG. 1 is a circuit diagram showing a conventional SQUID magnetometer.
Figure 4A:
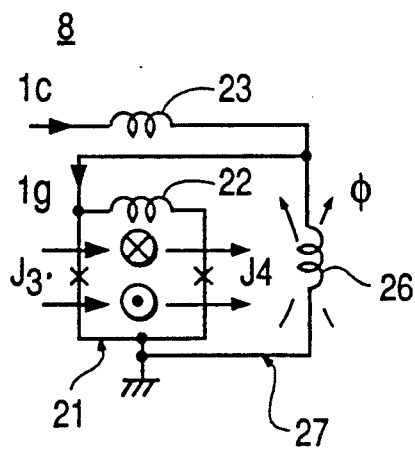
Figure 4B:
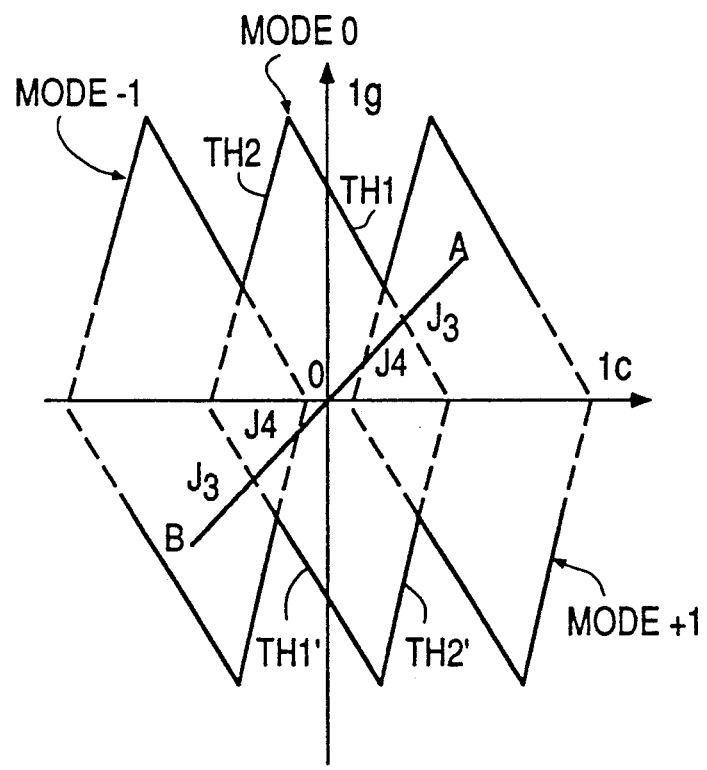

Referring to FIG. 7, the system comprises a superconducting pickup coil 111 similar to the pickup coil 1 of FIG. 1, a superconducting path 114 corresponding to the superconducting path 4 of FIG. 1 and connected to the pickup coil 111, a superconducting winding 112 corresponding to the superconducting winding 2 of FIG. 1 and provided in the superconducting path 114, and another superconducting winding 113 corresponding to the superconducting winding 3 of FIG. 1 and provided in the superconducting path 114. The loop 111, the winding 112 and the winding 113 form a closed superconduction loop together with the superconducting path 114.

Further, a SQUID sensor 119 is provided adjacent to the superconducting path 114 in magnetic coupling with the superconducting winding 112 similarly to the case of FIG. 1, and thereby the SQUID sensor 119 produces output voltage pulses in response to the detection of an incident magnetic flux $\Phi_x$ that interlinks with the pickup coil 111. As the construction and operation of the SQUID sensor 119 is substantially identical with the SQUID sensor 9 described previously, the description thereof will be omitted.

The output pulse is then directed, on the one hand, to a controller 116 of which construction and function will be described later, and on the other hand to a feedback circuit 118 of which construction will be described later in detail. The feedback circuit 118 operates similarly to the feedback circuit 8 of FIG. 1 in the normal circumstances and drives a superconducting winding 117 that corresponds to the superconducting winding 7 of FIG. 1 and magnetically coupled with the superconducting winding 113, by supplying a persisting feedback current $I_{FB}$ that is produced in response to the number of flux quanta that are stored in the feedback circuit 118.

Thereby, the magnetic flux $\Phi_x$ is canceled out gradually with increasing total number of output pulses of the SQUID sensor 119 and thus the total number of the flux quanta in the feedback circuit 118 until the magnetic flux $\Phi_x$ is totally canceled out. The controller 116 counts up the number of output pulses of the SQUID sensor 119 and displays the same as the detected intensity of the magnetic flux $\Phi_x$.

Figure 6:
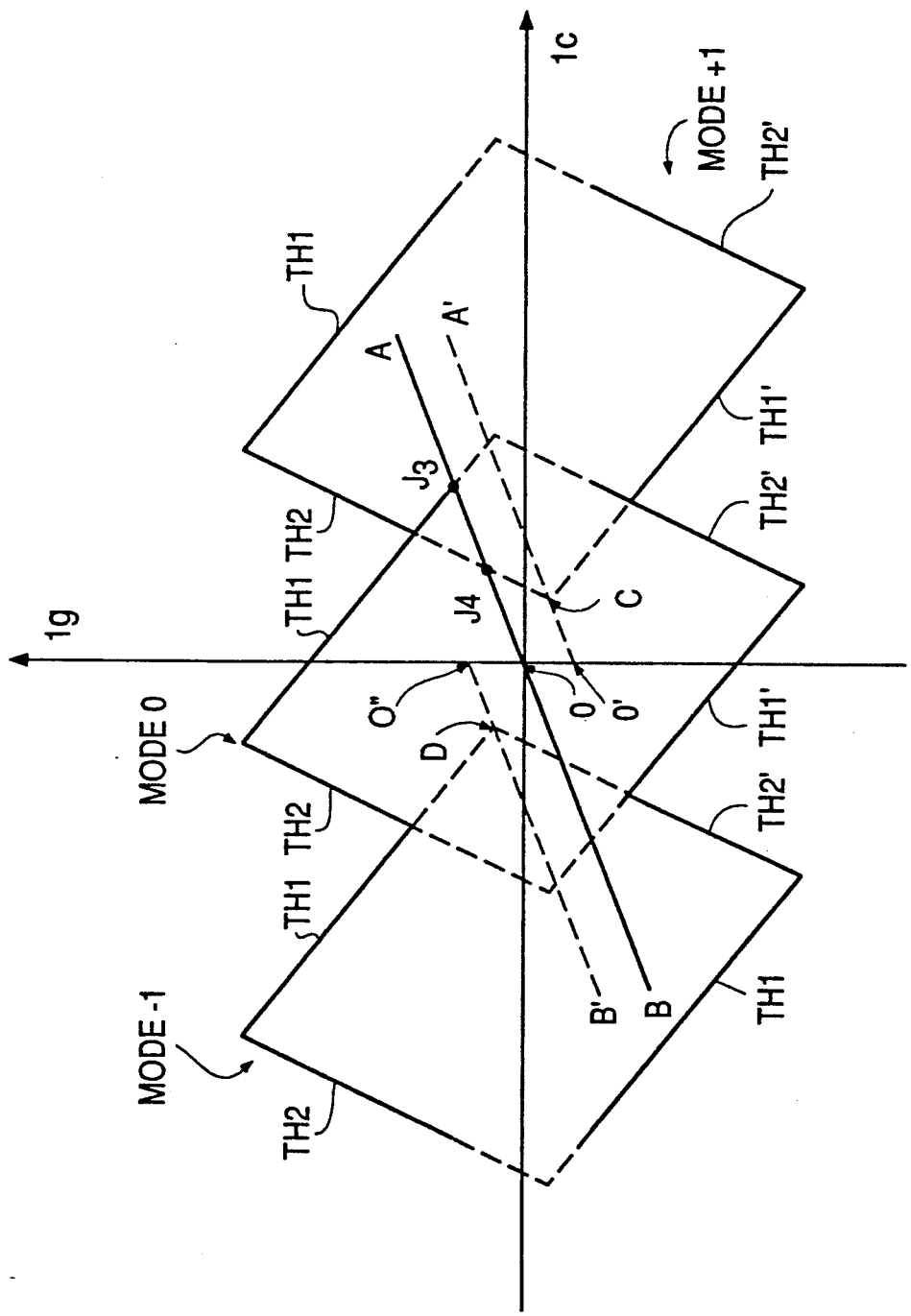
FIG. 6 is a diagram for explaining the problem pertinent to the SQUID magnetometer of FIG. 1.

In the present embodiment, in order to eliminate the problem of saturation of the feedback circuit 118 described previously with reference to FIG. 6, there is provided a heating fixture 115 adjacent to the superconducting path 114. The heating fixture 115 is connected electrically to the controller 116 and raises the temperature of the part of the conduction path 114 that is located adjacent thereto to a temperature above the critical temperature of the superconduction-normal conduction transition, in response to the drive current that is supplied from the controller 116. This critical temperature is 9.2° K. when niobium (Nb) or its alloy is employed for the superconducting path 114.

In response to the interruption of the induction current that has been caused to flow through the superconducting path 114 by the incident magnetic flux $\Phi x$, the magnetic flux $\Phi_x$ enters into the foregoing region that has experienced the transition to the normal conduction state and trapped therein in the form of flux quantum or quanta in response to the subsequent transition back to the superconduction state. Thereby the incident magnetic flux $\Phi_x$ is canceled out substantially by the trapped flux quanta and the induction current flowing through the superconducting path 114 is substantially resetted.

Simultaneously to the interruption of the induction current in the superconducting path 114, the controller 116 controls the feedback circuit 118 by a reset signal such that the feedback current is cleared. Because of the absence of the feedback current and hence the counteracting magnetic field in the superconducting winding 117 that is coupled magnetically to the path 114 at the superconducting winding 113, incorporation of the counteracting magnetic filed in the superconducting path 114 does not occur.

Once the induction current in the superconducting path 114 and the feedback current in the superconducting winding 117 are cleared as such, the measurement of the magnetic flux $\Phi_x$ is commenced for the increased strength of the magnetic flux, starting from the state that there is no induction current in the path 114 and no feedback current supplied by the feedback circuit 118. The controller 116 controls the timing of the foregoing interruption of the induction current and the feedback current by counting up the number of output pulses and comparing the total number of output pluses with a threshold value corresponding to the upper limit of number of the magnetic flux that can be stored in the storage loop 137. This threshold value of course corresponds to the limit of the measurement range that can be achieved without incorporating the foregoing resetting procedure. When it is confirmed that the SQUID sensor 119 produces no output pulses anymore that substantially changes the number of output pulses that has been counted up, the controller 116 converts the number of output pulses thus counted up into the strength of the magnetic flux and displays the same on a screen or other suitable display device.

Figure 8:
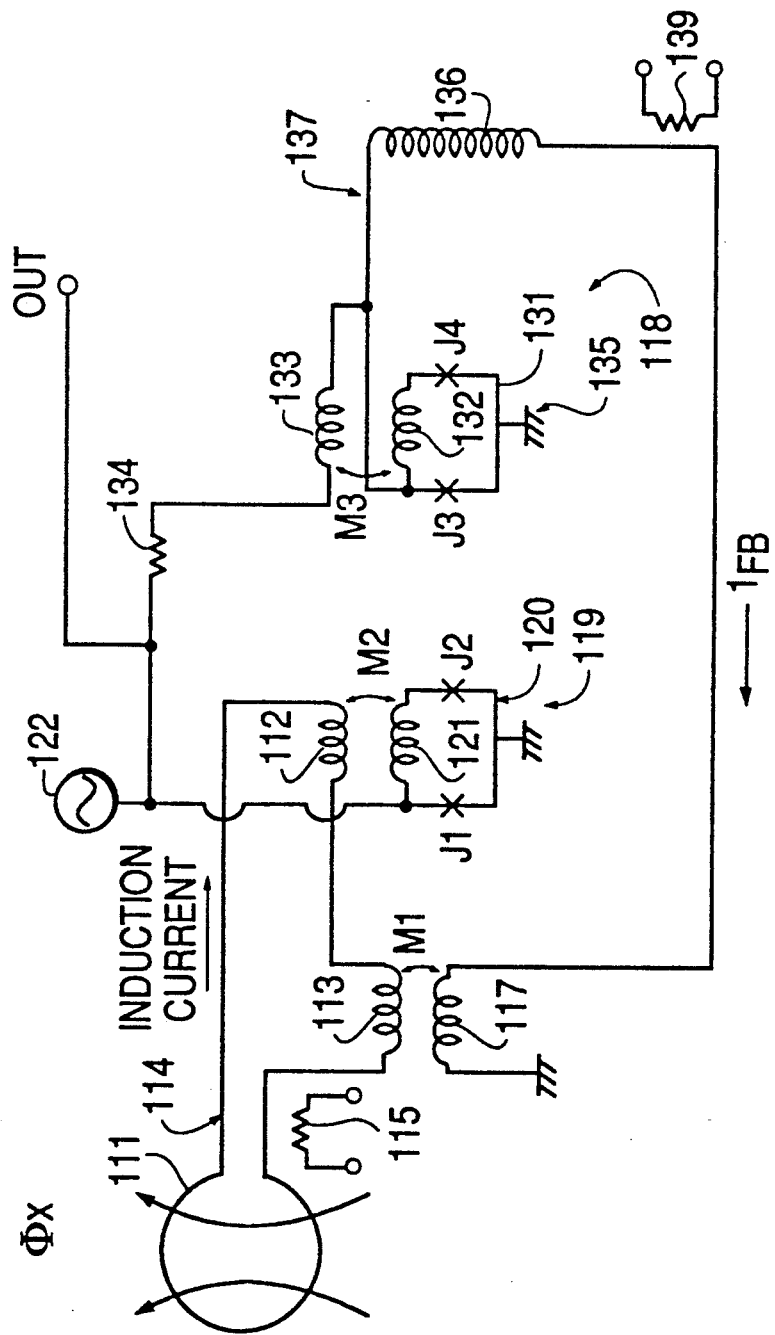
FIG. 8 is a more detailed circuit diagram of the system of FIG. 7.

FIG. 8 is a circuit diagram of the essential part of FIG. 7.

Referring to FIG. 8, the SQUID sensor 119 is a sensor substantially identical with the SQUID sensor 9 of FIG. 1 and comprises a superconducting winding 121 corresponding to the superconducting winding 111 and a pair of Josephson junctions J1 and J2. Similarly to the SQUID sensor of FIG. 1, the superconducting winding 121 is coupled magnetically to the superconducting winding 112 with a mutual conductance M2. For example, the superconducting winding 112 has an inductance value of 0.6 μH and the superconducting winding 121 has an inductance value of 30 pH. In this case, the mutual conductance M2 takes a value of about 4 nH. The Josephson junctions J1 and J2 may typically be characterized by the same critical current of 0.10 mA.

The feedback circuit 118, too, has a construction substantially identical with that of the feedback circuit 8 of FIG. 1. Thus, the feedback circuit 118 comprises a superconducting winding 132 that couples magnetically with a corresponding superconducting winding 133 that is connected to the SQUID sensor 119 via a resistor 134. The superconducting winding 132 forms a superconducting interferometer loop 131 together with Josephson junctions J3 and J4 similarly to the loop 21 of FIG. 1. Thereby, a write gate 135 similar to the write gate 25 of FIG. 1 is formed. In a typical example, the winding 132 has an inductance value of 7 pH while the winding 133 has an inductance value of 17 pH, and the windings 132 and 133 are coupled with each other with a mutual conductance of 5 pH. The Josephson junctions J3 and J4 may have the critical current of 0.12 mA and 0.10 mA, respectively. The Josephson junction J3 is connected to another superconducting winding 36 corresponding to the superconducting winding 26 of FIG. 1, and the winding 36 may typically have the inductance value of 10–30 μH.

Adjacent to the superconducting path 114, the heating fixture 115 to be described later in detail is provided as a means for interrupting the superconduction state of the path 114, as already described with reference to FIG. 7. Further, there is provided a second heating fixture 139 adjacent to the superconduction path connecting the superconducting winding 136 to the superconducting winding 117 such that the superconduction state of the path is canceled to the normal conduction state upon the energization of the heating fixture 139. In other words, the heating fixture 139 raises the temperature of the superconducting path extending between the winding 136 and the winding 117 upon energization and interrupts the feedback current that has been flowing therethrough in response to the magnetic flux that is stored in the superconducting winding 136. Thereby, the operation described previously with reference to FIG. 7 is obtained.

Figure 9A:
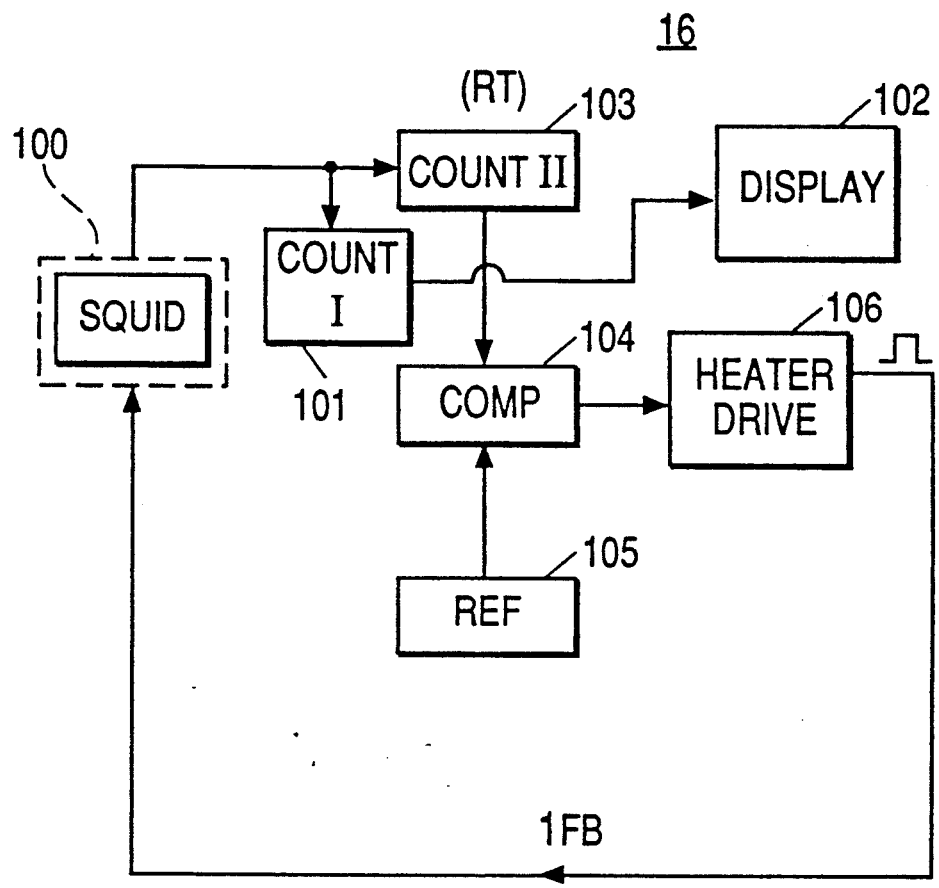
FIG. 9A is a diagram showing the overall system construction of the SQUID magnetometer that includes the circuit of FIG. 7.

FIG. 9A is a block diagram showing mainly the construction of the controller 116 shown in FIG. 7.

Referring to FIG. 9A, the controller 116 is provided outside a low temperature system 100 that contains the entire system of FIG. 7 except for the controller 116. The controller 116 comprises a first counter 101 supplied with the output voltage pulse from the SQUID sensor 119 in the low temperature system 100 for counting up the number of supplied output pulses. This count number is directly displayed on a display device 102. The output voltage pulse of the SQUID sensor 119 is further supplied to another counter 103 that counts up the number of supplied output pulses and sends the result to a comparator 104. The comparator 104 is further supplied with a predetermined numeric value from a reference circuit 105 and produces an output pulse when the count number of the counter 103 has exceeded the predetermined numeric value supplied from the reference circuit 105. This predetermined numeric value is set to correspond to the maximum magnetic flux that can be stored in the storage loop 127, and thus, the output pulse of the comparator 104 represents that the magnetic flux stored in the storage loop has exceeded the maximum value that can be stored therein. The output pulse of the comparator 104 is directed to a heater driver 106 that produces a driving pulse for the heating fixtures 115 and 139, and thereby, the input to the SQUID sensor 119 is resetted together with the feedback current of the feedback circuit 136.

Figure 9B:
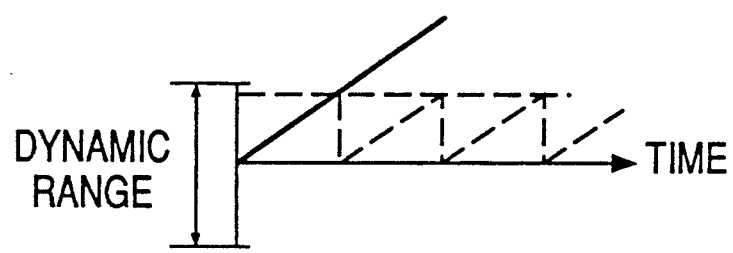
FIG. 9B is a diagram showing the switching of dynamic range of the SQUID magnetometer achieved in the system of FIG. 9A.

FIG. 9B shows the switching of the dynamic range of measurement thus achieved for the SQUID magnetometer of the present invention. Each time the counted number of the output pulse and thus the magnetic field detected has crossed the limit of the dynamic range defined by the predetermined numeric value given by the reference circuit 105, the induction current and the feedback current in the system of FIG. 8 are resetted, and the measurement is started from the beginning except that the previously detected magnetic flux $\Phi_x$ is entered into the superconducting input path 114 in the form of flux quantum. Thereby, the increase in the magnetic flux $\Phi_x$ occurred thereafter can be measured without restrained from the finite dynamic range of the SQUID magnetometer. It should be noted that the counter 101 counts the total number of pulses that are produced by the SQUID sensor 119 and thus the display 102 displays the total strength of the magnetic flux $\Phi_x$. The present system is particularly suited for measuring the magnetic field of which strength is changing gradually.

Figure 10A:
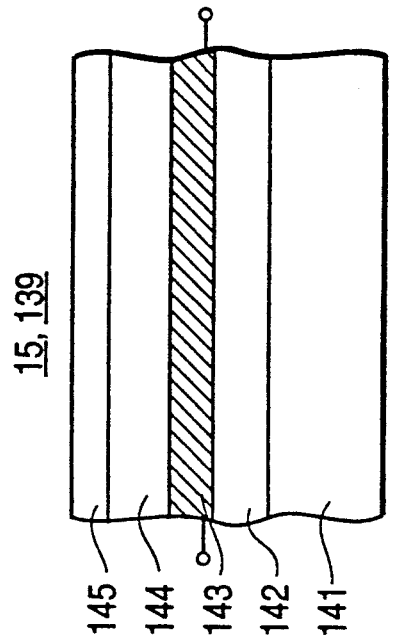
FIGS. 10A and 10B show the structure of a heating fixture employed in the SQUID magnetometer of the present invention.
Figure 10B:
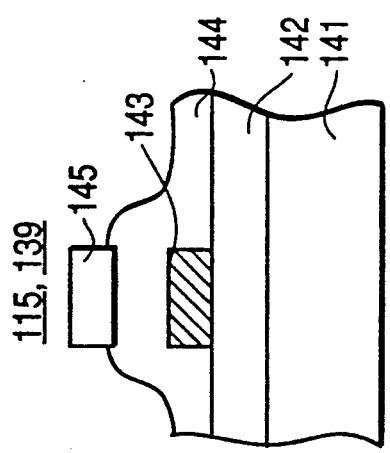

FIGS. 10A and 10B are diagrams showing schematically the construction of the heating fixtures 115 and 139.

Referring to the drawings, the heating fixture is provided on an insulator layer 142 which in turn is provided on a superconducting ground plane 141. This ground plane 141 may be provided on a substrate not illustrated (see FIG. 12 and related explanation). In a typical example, the substrate is made of silicon and the ground plane 141 is made of niobium. The insulator layer 142 may be made of silicon oxide. The heating fixture comprises a heating element 143 typically of molybdenum and patterned as will be described later. The heating element 143 is covered by an insulating layer 144 of silicon oxide and the like, and a superconducting pattern 145 of niobium is provided in the vicinity thereof such as on the top as illustrated, in corresponding to the superconducting path 114 or the superconducting feedback path of FIG. 8.

Figure 11B:
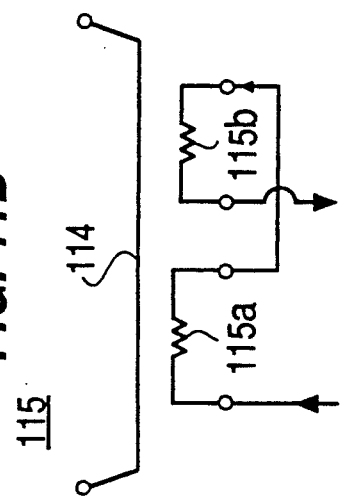
FIGS. 11A and 11B are the symbolic representations of the construction of the heating fixture in two alternative designs.
Figure 11A:
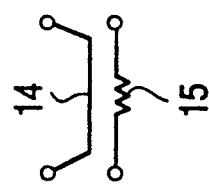

FIGS. 11A and 11B show the schematical arrangement of the heating fixture 115, wherein FIG. 11A shows the simplest case in which the heating fixture 115 comprising the heating element such as the element 143 shown in FIG. 10A is provided in the vicinity of the superconducting path 114. The same construction may be employed for the heating fixture 139.

In the actual construction of the heating fixture 115 or 139, it is preferred to design the heating fixture as shown in FIG. 11B, showing the example for the case of the heating fixture 115, such that the heating fixture 115 is formed of a first part 115a and a second part 115b, both disposed on a common insulator layer such that the magnetic flux produced by the first part 115a and the second part 115b cancel with each other. This arrangement is preferred as it substantially eliminates the chance of the magnetic flux, produced by the heating fixture upon the energization thereof, being trapped into the superconducting path 114. Thereby, the heating fixture 115 can be provided close to the superconducting path 114 and the transition of the path 114 to the normal conduction state will be made efficiently with less driving energy. This, of course, reduces the consumption of the liquid helium employed in the low temperature system 100. The construction of FIG. 11B is also used for the heating fixture 139.

FIG. 12 shows the cross-sectional view of the superconducting integrated circuit that is used for SQUID magnetometer of FIG. 8. It should be noted that this cross-sectional view merely shows the general construction of the superconducting integrated circuit that includes Josephson junctions therein, and does not correspond to any particular portion of the circuit of FIG. 8.

Referring to FIG. 12, the superconducting integrated circuit is constructed on a silicon substrate 140, and there are provided the niobium ground plane 141 and the silicon oxide insulator layer 142 consecutively. The niobium ground plane 141 has a thickness that at least exceeds the London's penetration depth and is set to 300 nm in the illustrated example. The silicon oxide insulator layer 142 has the thickness also of 300 nm. On the silicon oxide layer 142, there is provided a molybdenum resistance strip 143 corresponding to the heating element 143 of FIGS. 10A and 10B. The molybdenum resistance strip 143 is formed typically by deposition of a molybdenum layer followed by a patterning process and has a thickness of about 100 nm. On the resistance strip 143, another silicon oxide layer is deposited and subsequently patterned. Thereby an insulating region 143a is remained on the surface of the resistance strip 143, covering the upper major surface of the resistance strip 143 except for its opposing edges. Further, a niobium base electrode layer 143b is deposited on the structure thus formed in contact with the exposed edges of the resistance strip 143a. This niobium base electrode layer 143b is then patterned into two electrode segments separated from each other at the silicon oxide insulating region 143a. Such a molybdenum resistance strip 143 connected with superconducting electrode segments 143b forms the heating fixture 115 or 139 employed in the circuit of FIG. 8. The niobium base electrode layer 143b may have a thickness of about 200 nm.

On the superconducting base electrode 143b, one or more Josephson junctions J corresponding to the Josephson junctions J1, J2, J3 and J4 of FIG. 8 are provided. Each Josephson junction J comprises a thin AlOx tunneling barrier 144a deposited on the niobium base electrode layer 143b with a thickness of 3 nm, and a niobium counter-electrode 144b is provided on the tunneling barrier 144a. Thereby, a Josephson junction characterized by an insulator tunneling barrier layer sandwiched by a pair of superconducting layers is realized by the tunneling barrier layer 144a and the niobium layers 143b and 144b. The total thickness of the Josephson junction J including the tunneling barrier layer 144a and the electrode layer 144b may be about 150 nm. On the other hand, the lateral size of the Josephson junction J may be about 2.5 μm.

The Josephson junctions J thus formed are embedded in the insulator layer 144 that may typically have a thickness of 300 μm. The insulator layer 144 is formed with contact holes 144c having a diameter of about 1.5 μm, and another niobium conductor layer is provided on the layer 144 in contact with the Josephson junctions J through the contact holes 144c as the layer 145. Upon the energization of the resistance strip 143, the part of the niobium layer 145 located immediately above the resistance strip 143 experiences a transition to the normal conduction state.

Figure 13:
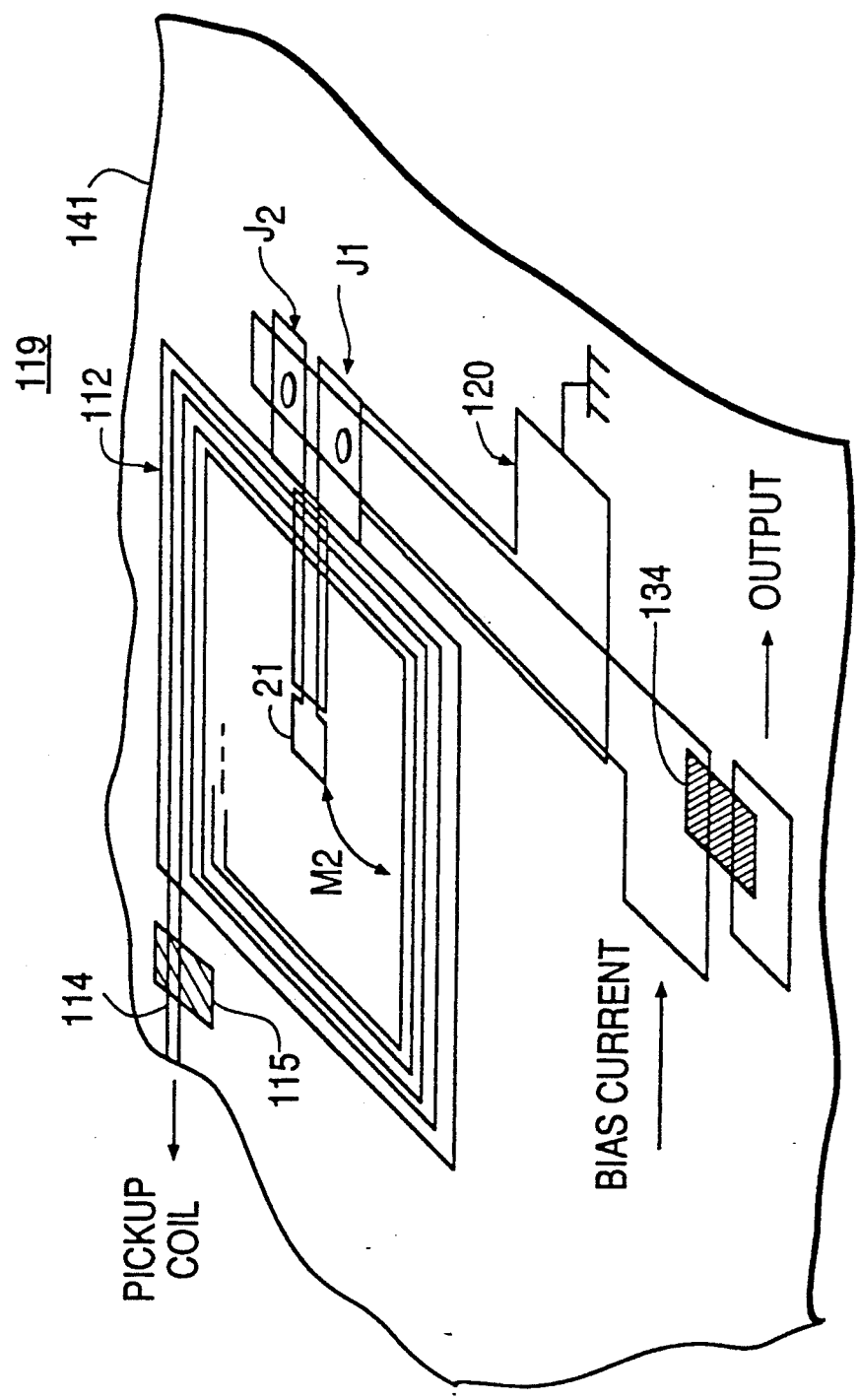
FIG. 13 is a perspective view showing the arrangement of the heating fixture in the SQUID sensor.

FIG. 13 shows a perspective view of the superconducting integrated circuit, particularly of the SQUID sensor 119 used in the SQUID magnetometer of FIG. 8. The SQUID sensor 119 is provided on the ground plane 141 and there is formed a planar winding pattern of niobium superconductor in correspondence to the superconducting winding 112 of FIG. 8. An end of this superconducting winding 112 extends toward the pickup coil as the superconducting path 114 and the heating fixture 115 is provided on the ground plane 141 at a portion thereof located immediately below the path 114. The actual arrangement of the heating elements in the heating fixture 115 may be configured as illustrated in FIG. 11B. On the superconducting ground plane 141, the superconducting winding 121 is provided within the loop of the winding 112 at a level below the winding 112 with magnetic coupling thereto, and the Josephson junctions J1 and J2 are provided on the ground plane 141 at the same level as the superconducting winding 121. The Josephson junctions J1 and J2 are connected to the ground plane 141 via the superconducting loop 120 provided on the ground plane 141 at a level below the Josephson junctions J1 and J2, and further connected to the resistor 134 via a superconducting path on the ground plane 141 at the level above the Josephson junctions J1 and J2.

Next, a second embodiment of the present invention will be described with reference to FIG. 14.

Referring to the drawing, the present embodiment employs a Josephson digital up/down counter 151 and a Josephson D/A converter 152 for the feedback circuit 118 of FIG. 7. Thus, the up/down counter 151 is supplied with the output pulses of the SQUID sensor 119 and counts up the number of pulses. When there is a pulse having the opposing polarities, the up/down counter 151 of course reduces the number of counts held therein. The D/A converter 152, on the other hand, is supplied with the digital data representing the number of pulses thus counted up from the up/down counter 151 and converts the digital data to an analog feedback current. This feedback current is supplied to the superconducting winding 117 similarly to the first embodiment and induces the counteracting magnetic flux in the superconducting winding 113 coupled to the superconducting winding 117. The rest of the operation of the present embodiment is substantially identical to that of the first embodiment and the description thereof will be omitted.

Figure 14:
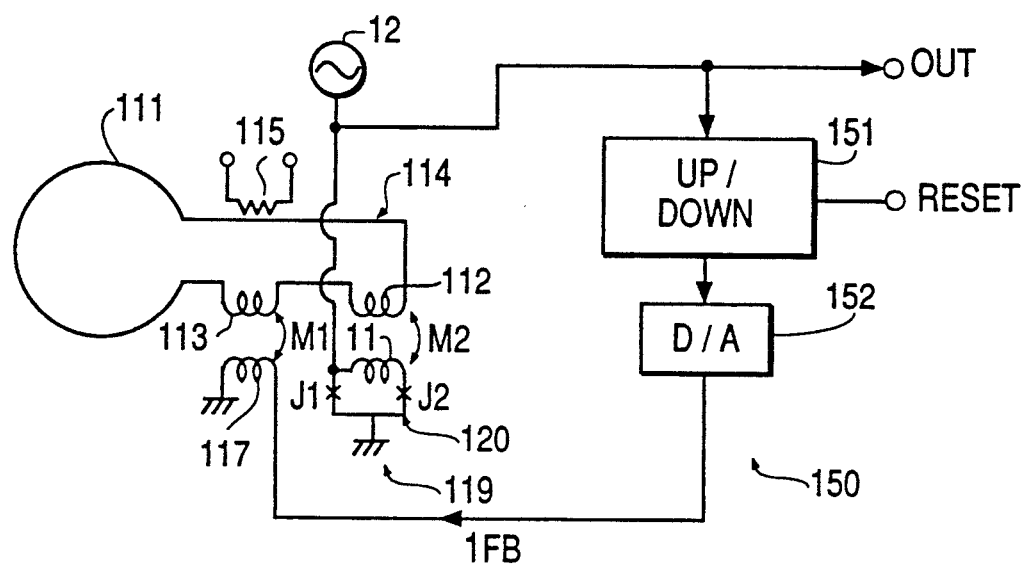
FIG. 14 is a block diagram showing the construction of a second embodiment of the present invention.
Figure 15:
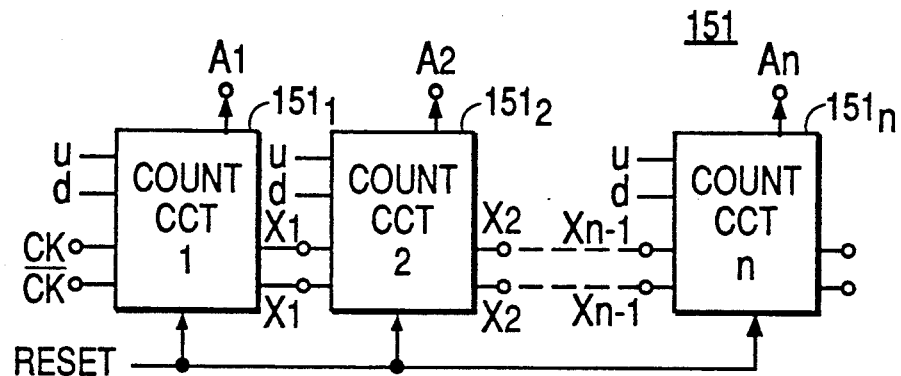
FIG. 15 is a block diagram showing the construction of an up/down counter circuit used in the construction of FIG. 14.

FIG. 15 is a block diagram of the Josephson up/down counter 151 used in the embodiment of FIG. 14. The circuit is the one disclosed in the U.S. Pat. No. 4,947,118 which is incorporated herein as reference.

Referring to FIG. 15, the up/down counter 151 consists of a number of counting circuits $151_1$–$151_n$ connected in series. A first counting circuit is supplied with a clock signal CK and an inversion thereof, /CK, and outputs a binary data $A_1$ as the LSB (least significant bit) of the counted value. A second counting circuit, on the other hand, is supplied with a binary output data $X_1$ and an inversion thereof $/X_1$ from the first counting circuit as a carry and outputs a second binary data $A_2$ representing the second bit of the counted value, and so on. Further, each counting circuit in the up/down counter is supplied with a reset signal RESET and thereby the binary data $A_1, \ldots$ as well as the carry $X_1, /X_1, \ldots$ are resetted.

Figure 16:
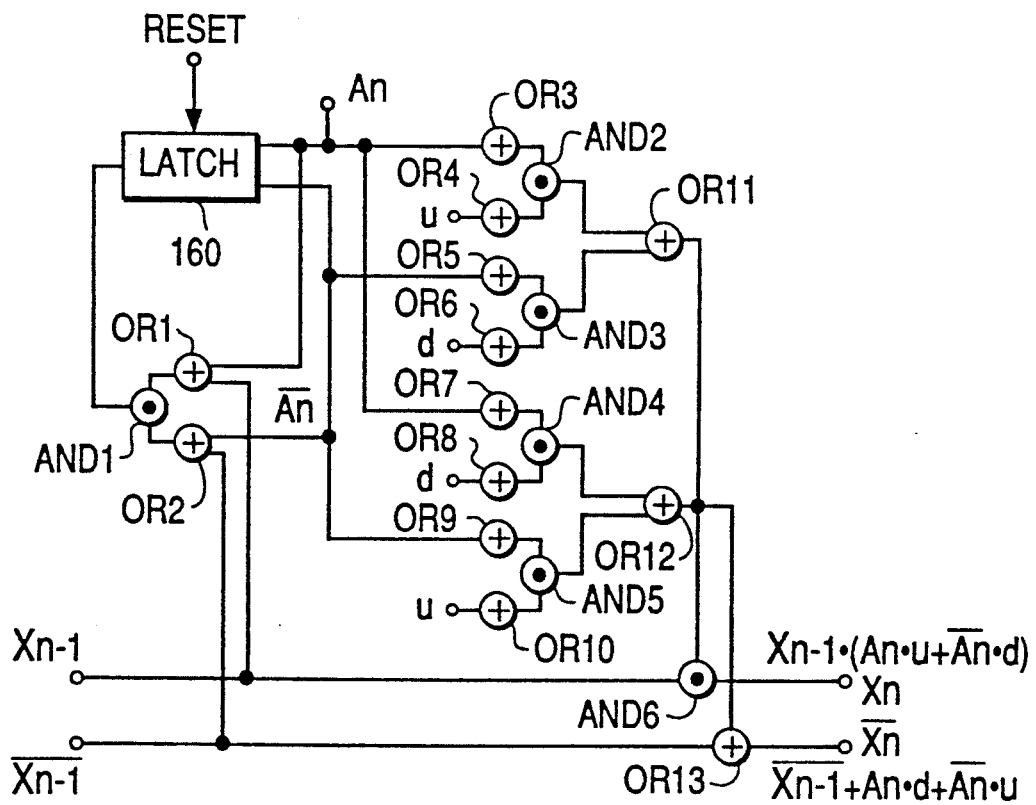
FIG. 16 is a circuit diagram showing the circuit construction of each counter block employed in the up/down counter of FIG. 15.

FIG. 16 is a circuit diagram of one of the counting circuits used in the up/down counter of FIG. 15. It should be noted that all other counting circuits have an identical construction and the description thereof will be omitted. This circuit is also disclosed in the above identified reference.

Referring to FIG. 16, each counting circuit includes a latch circuit 160 of which construction is shown in FIG. 17, AND gates designated as AND1 through AND6 and represented symbolically by dots (.), and OR gates designated as OR1 through OR13 and represented symbolically by plus (+). In the case that the counting circuit is the first stage counting circuit, i.e., n=1, the clocks CK and /CK are given as the inputs $X_{n-1}$ and $/X_{n-1}$, respectively.

Each counting circuit $151_1$, $151_2$, ... produces conjugate outputs $X_n$ and $/X_n$ in response to the inputs $X_{n-1}$ and $/X_{n-1}$ given thereto according to the following logic operation:

$$/X_n = /X_{n-1} \cdot (A_n \cdot u + /A_n \cdot d) \tag{1}$$

$$X_n = X_{n-1} + A_n \cdot d + /A_n \cdot u \tag{2}$$

wherein, u and d represent binary signals for controlling the counting circuit in the incremental counting mode and decremental counting mode. For example, when u=1 and d=0, the counting circuit 151₁ increases the number of count 1 in response to incoming of the clocks CK and /CK. Further, $A_n$ and $/A_n$ designate respectively the normal and inverted outputs produced by the latch circuit 160.

It should be noted that the output $A_n$ of the latch circuit 160 is produced based upon the following logic operation:

$$A_n = (X_{n-1} + (A_n) - 1) \cdot (/X_{n-1} + (/A_n) - 1) \qquad (3)$$

where, $(A_n) - 1$ and $(/A_n) - 1$ represent the outputs held in the latch circuit 160.

As shown in FIG. 17, the latch circuit 160 comprises OR gates OR61–OR64, a power circuit 160a, and a timed inverter TI61. The power circuit 160a includes a power source PWR61 for producing a first-phase power signal $\phi 1$, a first delay circuit DEL61 supplied with the first-phase power signal and delaying the same by $2\pi/3$ radian to produce a second-phase power signal $\phi 2$, and a second delay circuit DEL62 supplied with the second-phase power signal and delaying the same further by $2\pi/3$ radian to produce a third phase power signal $\phi 3$. The relationship between these three phase power signals is shown in FIGS. 18A–18C.

Each of the OR gates OR61–OR63 comprises the Josephson junctions that are driven by one of the three-phase power signals as will be described later. Thereby, each OR gate produces an output voltage signal in response to the output voltage signal supplied thereto by causing a transition in the Josephson junctions therein from the zero-voltage state to the finite voltage state during the interval wherein the power signal supplied thereto has a level larger than about ⅓ of the peak value. The Josephson circuit is characterized by a latching operation that holds, once switched, the finite voltage state as long as the power signal supplied thereto has a finite value larger than about ⅓ of the peak value. This duration of the power signal having a value larger than about ⅓ of its peak value will be referred to as active region. For example, when an input of the OR gate OR61 is "1" and the first-phase power signal $\phi 1$ supplied thereto is in the active region, the OR gate 61 latches the input signal "1" and holds the same until the first-phase signal $\phi 1$ decreases below the active level. The OR gates OR62 and OR63 operate in the same manner as the OR gate 61.

Referring to FIG. 17, the gate OR61, driven in response to the first-phase signal $\phi 1$, is supplied with the output of the AND1 gate of FIG. 16 and transfers the same to the next gate OR62 during the interval of the first-phase signal. The gate OR62, in turn, latch the supplied data during the active region of the second-phase signal $\phi 2$ and transfer the same to the gate AND60. The gate AND60 is supplied with a reset control signal from the gate OR64 in response to the second-phase signal $\phi 2$ and transfers the input data supplied thereto from the gate OR62 to the gate OR63 during the active region of the second-phase signal, provided that the reset control signal has a logic value 1. For this purpose, the gate OR64, driven in response to the second-phase signal $\phi 2$, is given with a signal RESET CONTROL that assumes the logic value 1 during the normal counting mode while the logic value 0 when the reset signal RESET of FIG. 14 is given.

The timed inverter TI, on the other hand, is driven by the third-phase signal $\phi 3$ with the same timing as the OR63 and receives an output of the gate AND60 and inverts the same further to produce an inverted output $/A_n$. Thereby, the OR gate OR63 outputs the latched output $A_n$ with the same timing as the inverted output $/A_n$. The delay circuits DEL31 and DEL32 may be provided within or outside the chip.

Referring to FIGS. 15 and 16 again, the operation for increasing the count of the up/down counter 151 is performed as follows. In the description hereinafter, only the operation of the first stage counting circuit 151₁ is described in detail and the description of other circuits in the following stages will be omitted.

From Eqs. (1) and (2), the logic outputs $X_1$ and $/X_1$ for the first stage counting circuit 151₁ can be expressed as $$X_1 = CK \cdot A_1 \qquad (4),$$

and $$/X_1 = /CK + /A_1 \qquad (5),$$

wherein it is assumed that u=1 and d=0 in correspondence to the up-counting mode of the up/down counter.

Before supplying a first clock, in other words, before the counting started, there holds a relation CK=0, /CK=1 in correspondence to no incoming clocks, and a relation $A_1 = 0$ and $/A_1 = 1$ in correspondence to no count value held in the counter. Further, the output $X_1$ of the counter 151₁ should be zero. Thereby, there hold a relation $X_1 = 0$, $/X_1 = 1$ as will be understood from the foregoing Eqs. (4) and (5).

Upon incoming of the first clock (CK=1, /CK=0), the output $A_1$ is still zero at the moment that the first clock comes in, and the output of the AND1 gate, expressed generally by $(CK + A_1) \cdot (/CK + /A_1)$, assumes the logic value "1". This output of the AND1 is then supplied to the latch circuit 160 and delayed therein for an interval corresponding to the three phase power signals $\phi 1$, $\phi 2$ and $\phi 3$. After the foregoing interval, the output $A_1$ of the latch circuit 160 assumes the level "1."

It should be noted that the OR gates OR1 through OR13 and the AND gates AND1 through AND6, including those gates that process the output $A_1$ of the latch circuit 160, are operated in response to a bias current that is synchronous to the first phase power signal $\phi 1$. Thereby, the outputs $A_1$ and $/A_1$ supplied from the latch circuit 160 at the moment in which the OR and AND gates are operational, assume the states that are identical with those for the case where there has been no input clock. Thus, the outputs $X_1$ and $/X_1$ of the counting circuit 151₁ assume the values 0 and 1, respectively during the interval of the first clock.

When a second clock is supplied (CK=1, /CK=0), the output of the AND1 gate becomes "0" immediately because of the outputs ($A_1 = 1$ and $/A_1 = 0$) held in the output of the latch circuit 160. Thereby, this output "0" is supplied to the latch circuit 160 and an output $A_1$ of "0" is obtained from the latch circuit 160 in response thereto. Further, the previous values $A_1$ and $/A_1$ held in the latch circuit 160 are processed by the AND and OR gates AND2–AND6 and OR3–OR13 in response to the first phase power signal occurred during the interval of the second clock. Thereby the outputs $X_1$ and $/X_1$ assume the values 1 and 0, respectively.

Further, when a third clock comes in, the output of the AND1 gate becomes "1" because of the previous values 0 and 1 of the output data $A_1$ and $/A_1$ of the latch circuit 160 in combination with the logic value of the clocks (CL=1, /CL=0), and the new output of the AND gate 1 is supplied to the latch circuit 160. Thereby, the output of the counting circuit $151_1$ is obtained as $X_1 = 0$ and $/X_1 = 1$.

Thus, the output $A_1$ changes as 0, 1, 0, 1, 0, 1, . . . while the output $X_1$ changes as 0, 0, 1, 0, 1, 0, 1, 0, . . . with the incoming of each clock. Thereby, the output $X_1$ represents the carry output of the counter. The second counter circuit $151_2$, on the other hand, receives the outputs $X_1$ and $/X_1$ and produces the output $A_2$ as 0, 0, 1, 1, 0, 0, . . . with the incoming clock. The other counting circuits operate in the same way.

When the up/down counter 151 operates to decrease the counted value (down count), the binary data u and d are set as u=1 and d=1, and thus borrows are obtained by the outputs $X_n$ and $/X_n$ as $$X_n = X_{n-1} \times /A_n \quad (6)$$

$$/X_n = /X_n + A_n \quad (7)$$

Next, the D/A converter 152 used in the system of FIG. 14 will be described with reference to FIGS. 19 through 21. These circuits are the one described also in the previously mentioned U.S. Pat. No. 4,047,118.

Figure 19:
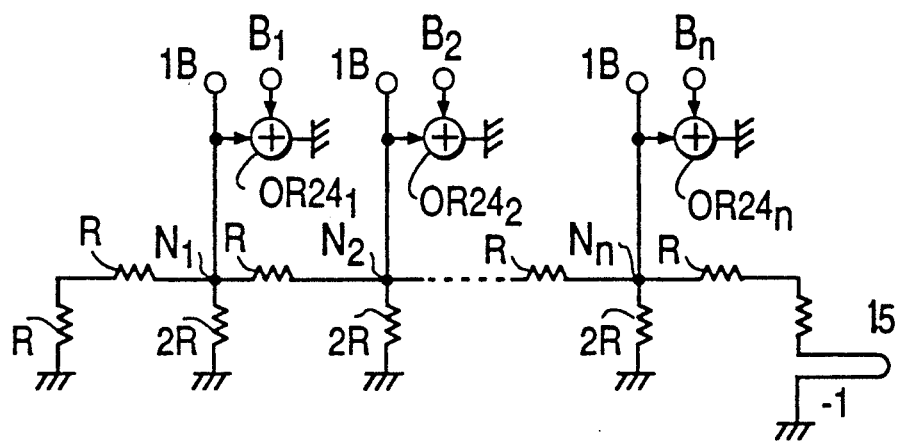

The DA converter shown in FIG. 19 is the so-called R-2R ladder type D/A converter and has a construction to control the currents supplied to nodes N1-Nn by OR gates $24_1$ through $24_n$ which are formed by Josephson junctions. In FIG. 19, the reference R designates a resistor having a resistance R, and the reference 2R designates a resistor having a resistance 2R. B1 through Bn designate respectively the bits of a digital input, expressed by power of 2: $B1=2^0$, $B2=2^1$, . . . , $Bn=2^{n-1}$. IB designates a bias current in the DA converter. When the bit B1 is "0", the gate $OR24_1$ is in the zero-voltage state, and thus the bias current IB flowing through the OR gate $OR24_1$ is grounded. Conversely, when the bit B1 is "1", the OR gate OR241 is in the finite voltage state, and thus the bias current IB is caused to flow into the node N1. Each node is equivalently grounded through three of the resistors 2R, and accordingly, when the bias current $I_B$ flows into the node Nn, a current $I_B/3$ flows into each resistor 2R, and thus a current ($I_B/3$) Bn flows through an output line 15. With regard to Bn−1, a current which is a half of the current $I_B/3$ flowing into the node Nn, i.e. $I_B/6$, flows into the output line 15, and with regard to $B_{n-2}$, a current $I_B/12$ flows into the output line 15. Consequently, the current I flowing the output line 15 is expressed by the following equation:

$$I = I_B/3 \times (B_n + B_{n-1}/2 + \ldots + B_1/2^{n-1}) \quad (8)$$

Namely, the D/A converter shown in FIG. 19 is an n-bit binary D/A converter in which the bit $B_1$ indicates the LSB and the bit $B_n$ indicates the MSB (most significant bit).

Figure 20:
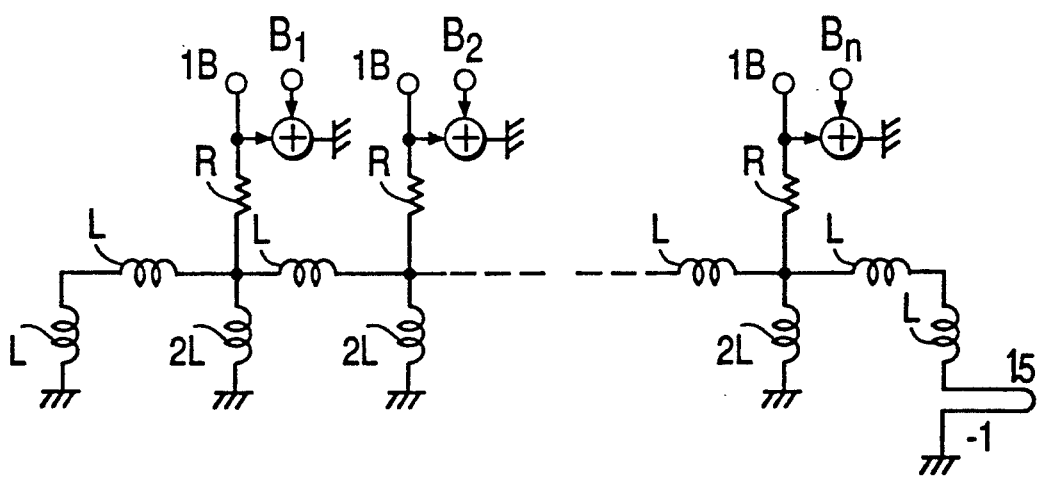

The resistors R and 2R in FIG. 19 can be replaced by superconducting inductance L and 2L as shown in FIG. 20. Note these superconducting inductances can be easily realized. The current I flowing through the output line 15 is also expressed by the above Eq. (8).

Figure 21:
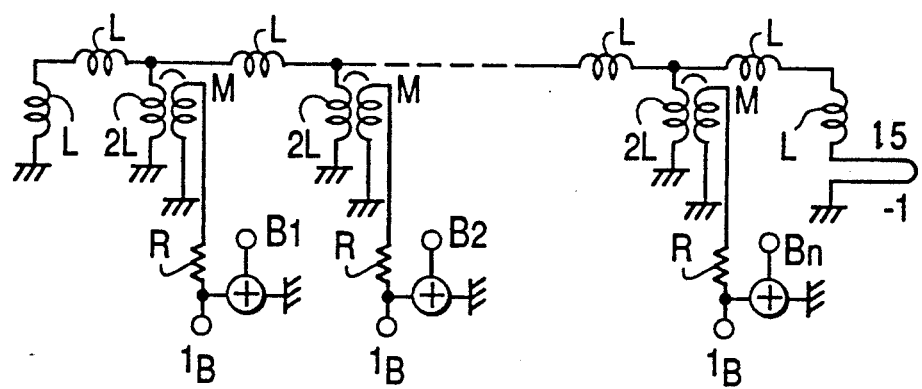
FIGS. 19-21 are circuit diagrams showing the construction of the D/A converter used in the system of FIG. 14.

Furthermore, the D/A converter can be realized by a circuit shown in FIG. 21, which uses the mutual conductance M. A current I flowing in the output line 15 in FIG. 21 is expressed by the following equation:

$$I = I_B/6L \times M \times (B_n + B_{n-1}/2 + \ldots + B_1/2^{n-1}) \quad (9)$$

Figure 22A:
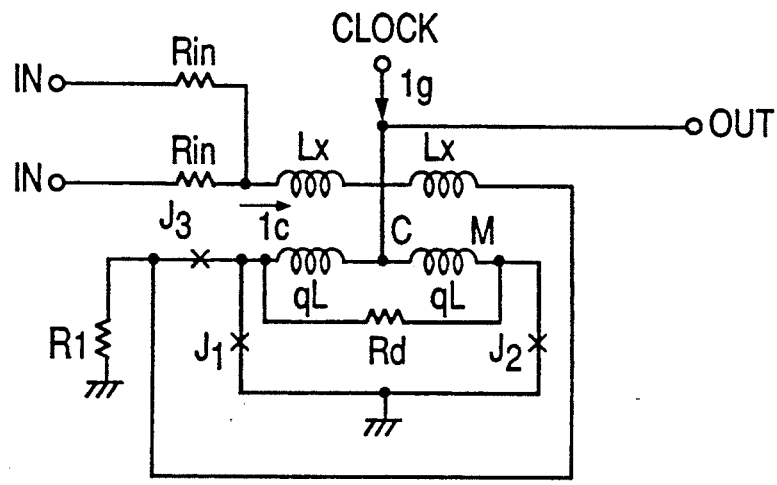
FIGS. 22A-22C are circuit diagrams of various logic elements used in constructing the up/down counter and the D/A converter in the system of FIG. 14.
Figure 22B:
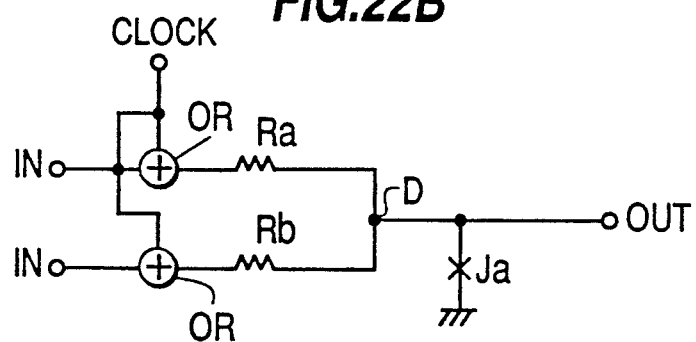
Figure 22C:
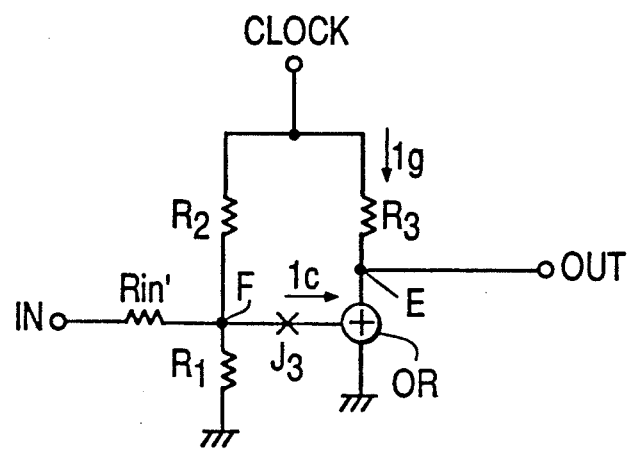

FIGS. 22A–22C are diagrams showing the construction of the OR gate, AND gate and the timed inverter that are used in the feedback circuit and the D/A converter described previously. These circuits are described in Fujimaki et al., "Josephson Modified Variable Threshold Logic Gates for Use in Ultra-High-Speed LSI," IEEE Transactions on Electron Devices, vol. 36, no. 2, February 1989 which is incorporated herein as reference.

Referring to FIG. 22A. the OR gate forms an asymmetric interferometer and includes therein Josephson junctions J1 and J2, wherein the Josephson junction J1 has a critical current pIm while the Josephson junction J2 has a critical current qIm. Here, there holds a relationship p+q=1. Further, there is included an inductance L that is divided into a left branch having an inductance qL (designated hereinafter as "inductance qL"), and a right branch having an inductance pL (designated hereinafter as "inductance pL"), wherein the branch qL has an end connected to the ground via the Josephson junction J1, and the branch pL has an end connected to the ground via the Josephson junction J2. The other end of the branch qL and the other end of the branch pL are connected each other at a central node C, to which the clock signal is supplied as a bias current Ig. Further, there are provided an inductance Lx to establish a magnetic coupling with the branches qL and pL via a mutual inductance M. The inductance Lx has an end connected to one or more input terminals for receiving an input current Ic and another end connected via a third Josephson junction J3 to the inductance qL at the end that is connected to the ground via the Josephson junction J1.

In operation, the Josephson junctions J1–J3 are all in the superconducting state in the initial state wherein the level of the clock signal is set at zero. Thereby, the bias current Ig flows to the ground directly with increased level of the clock signal and there appears a low or zero-output at an output terminal OUT connected to the node C. The Josephson junctions J1–J3 remain in the zero-voltage state as long as there is no input current Ic even when the clock signal has turned to the high level state.

When the current flowing through the Josephson junctions J1 and J2 has exceeded a predetermined threshold as a result of increase in the input current Ic, on the other hand, the Josephson junctions J1 and J2 cause a transition to the finite-voltage state. Thereby, the bias current Ig starts to flow through the Josephson junction J3 to the ground, and in response to this, the Josephson junction J3 is turned off. As a result, a high output is obtained at the output terminal. Obviously, the transition of the state of the output is caused in response to the sum of the input current at the input terminal IN, and thus, the circuit of FIG. 22A operates as a logic sum or OR-circuit. More detailed analysis of the circuit can be found in the foregoing reference by Fujimaki et al.

FIG. 22B shows a construction of a Josephson AND gate used in the up/down counter and the D/A converter employed in the embodiment of FIG. 14.

Referring to FIG. 22B, the AND gate comprises input terminals IN connected each other at a node D via an OR gate described in FIG. 22A and a Josephson junction Ja thus shunts the node D to the ground. In the drawing, the OR gates are shown by a symbol "+" similarly to the foregoing illustrations and driven in response to the clock as already described. The output of the gate is obtained at an output terminal connected to the node D. When the OR gates are resetted by the low level state of the clock, the AND gate is of course resetted.

In operation, the Josephson junction Ja is designated to have a threshold current of transition such that the transition occurs only when there are input currents at both input terminals IN. Thereby, the circuit produces a logic product of the input logic signals. More complete description of the Josephson AND gate will be found in the foregoing IEEE article by Fujimaki.

FIG. 22C shows the timed inverter used in the second embodiment of FIG. 14. The timed inverter comprises an OR gate represented by the symbol "+" which is driven by the clock current Ig in response to the clock signal CLOCK that is supplied to the OR gate via a resistor R3 and resetted periodically by the low level state of the clock. Further, the clock signal is voltage-divided by resistances R1 and R2 and supplied to the OR gate via a Josephson junction Js from a node F that is formed at a junction between the resistor R1 and the resistor R2. Further, an input signal is supplied to the OR gate via the node F. For this purpose, an input terminal IN is connected to the node F via a resistor Rin'.

In operation, when the current flowing from the node F to the OR gate is below a critical current level Ic in response to the no-input current state at the input terminal IN, the current supplied to the OR gate in response to the clock signal maintains the output of the OR gate at a high level state. On the other hand, when there is an input current at the input terminal IN, the current supplied from the node F to the OR gate exceeds the critical current Ic and the Josephson junction J3 is turned off in response thereto. Thereby, the input current to the OR gate disappears and the output of the OR gate, obtained at a node E between the OR gate and the resistor R3, remains in the low level state. Thus, an inversion of the input logic signal is obtained at an output terminal OUT connected to the node E.

Next, a third embodiment of the present invention will be described.

In the SQUID magnetometer of the embodiments described heretofore, it will be understood that it takes some time to measure the magnetic field. The magnitude of the magnetic field is measured by sending feedback pulses to the superconducting winding 117 sequentially until the magnetic field is canceled out. Thereby, the time necessary for the measurement is determined by the slew rate of the feedback magnetic pulses that are given by the feedback circuit. In the case of the first embodiment, it should be noted that the magnitude of the counteracting magnetic flux that is produced by the feedback circuit is determined by the inductance of the superconducting winding 136 or the magnetic coupling M1 between the windings 113 and 117 and cannot be changed.

In the case of the second embodiment, it is possible to change the magnitude of the feedback current pulse to control the feedback magnetic field. For example, one can increase the magnitude of the unit feedback magnetic flux $\Delta\Phi$ (FIG. 5B) that is coupled to the loop 114 in response to each output pulse of the SQUID 119, by changing the design of the Josephson D/A converter 152. Thereby, the time needed to determine the magnitude of the incident magnetic field is certainly reduced. However, when the magnitude of the unit feedback magnetic flux $\Delta\Phi$ is increased as such, the resolution or sensitivity of the magnetic field measurement is inevitably deteriorated because of the increased quantization error caused by the increased step height in the feedback magnetic field shown in FIG. 5B.

Figure 23:
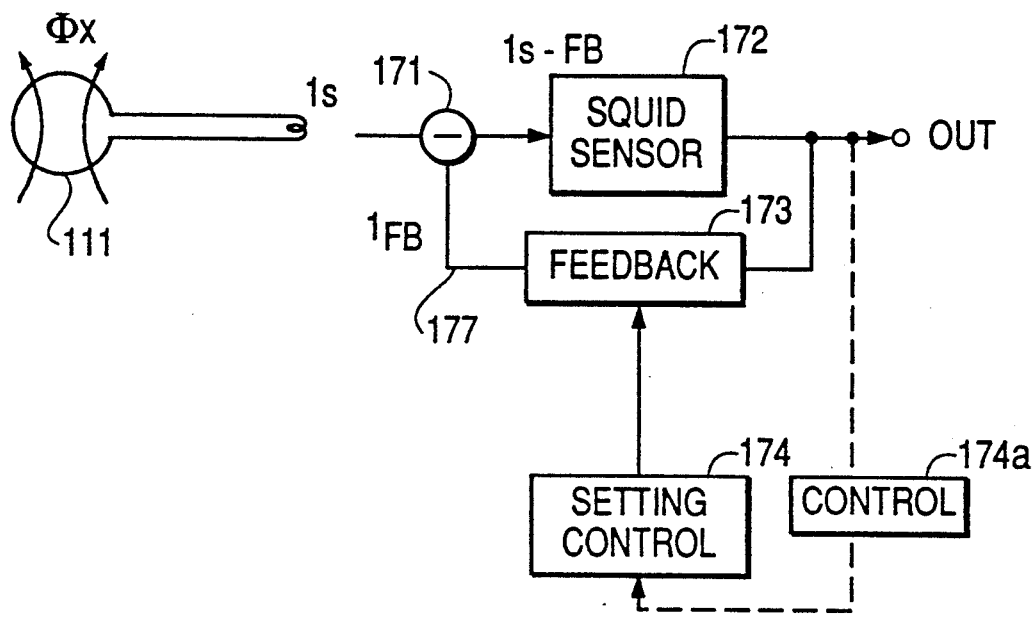
FIG. 23 is a block diagram showing the general construction of a third embodiment of the present invention.

FIG. 23 shows a third embodiment of the present invention for eliminating the foregoing problem and providing magnetic field measurement of which sensitivity and response time can be changed as desired according to the needs.

Referring to FIG. 23, the SQUID magnetometer of the present embodiment comprises a SQUID sensor 172 substantially identical with the SQUID sensor 119 of the previous embodiments and a feedback circuit 173 that produces the feedback current IFB in response to the pulse output of the SQUID sensor 172. This feedback current is fed back to the SQUID sensor 172 through a feedback loop 177 corresponding to the feedback loop 137 at a node 171 which may be a superconducting winding 117 of the previous embodiments. Thereby, the incident magnetic flux $\Phi_x$ detected by the pickup coil 111 is canceled out step by step by the feedback magnetic field as shown in FIG. 5B similar to the foregoing embodiments.

In the case of the feedback circuit 173, the magnitude of increment of the feedback current IFB can be changed as desired in response to a setting control signal SETTING supplied from a setup controller 174 which in turn may be controlled manually by the operator. This setup controller 174 may be provided outside the low temperature enclosure 100 or inside. Alternately, the setup controller 174 may be controlled in response to the output pulse of the SQUID sensor 172 by another controller that is supplied with the output pulse of the SQUID sensor 172 and produces a control signal controlling the setup controller 174.

Figure 24:
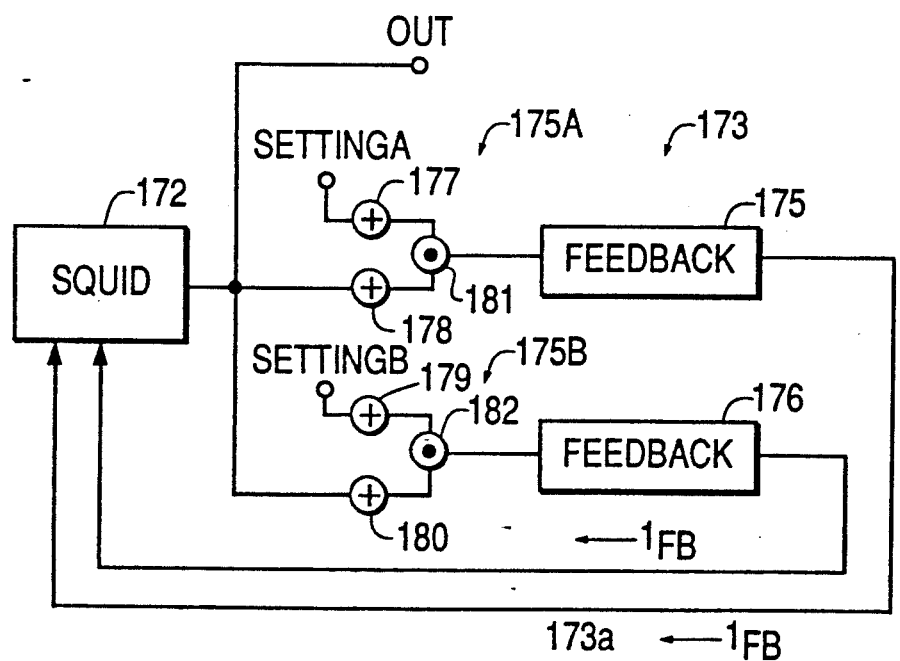
FIG. 24 is a block diagram showing a more detailed construction of a part of the embodiment of FIG. 23.

FIG. 24 shows the actual construction of the feedback circuit 173. Referring to FIG. 24, the feedback circuit 173 comprises a first feedback circuit 175, a second feedback circuit 176, superconducting OR gates 177-180 and superconducting AND gates 181 and 182, wherein the feedback circuits 175 and 176 have a substantially identical construction as the feedback circuit 118 except that the magnetic coupling of the superconducting windings 113 and 117 (FIG. 7) is included in the circuits 175 and 176. In the circuit 175 and 176, the magnitude of the mutual conductance M1 (FIG. 7) between the windings 113 and 117 is changed such that the magnitude of the unit feedback magnetic flux that is coupled to the superconducting loop 114 in response to each increment of the feedback current IFB is changed.

In order to select one of the feedback circuits 175 and 176, the present embodiment employs superconducting logic switches 175A and 175B respectively connected to the feedback circuit 175 and the feedback circuit 176. The logic switch 175A comprises a superconducting OR gate 181 supplied with the output pulse of the SQUID sensor 172, another superconducting OR gate 177 supplied with the setting signal, and an AND gate 181 supplied, on one hand, with an output of the OR gate 178 corresponding to the output of the SQUID sensor 172 and an output of the OR gate 177 corresponding to the setting signal. Thus, the output of the SQUID sensor 172 is passed to the feedback circuit 175 only when the setting signal, given by the ordinary setup controller 174, has a high-level state. Similarly, the superconducting logic switch 175B passes the output of the SQUID sensor 172 only when the setting signal given thereto has the high level state. Thereby, the slew rate of the SQUID magnetometer is changed, depending on the setting signal that selects the superconducting feedback circuit. The superconducting OR gates and the superconducting AND gates used in FIG. 23 are already described with reference to FIGS. 22A-22C and the repetition of the description will be omitted. Further, the setup controller 74 may be any known decoder circuit or even a mechanical selector switch and the description thereof will be omitted.

Figure 25:
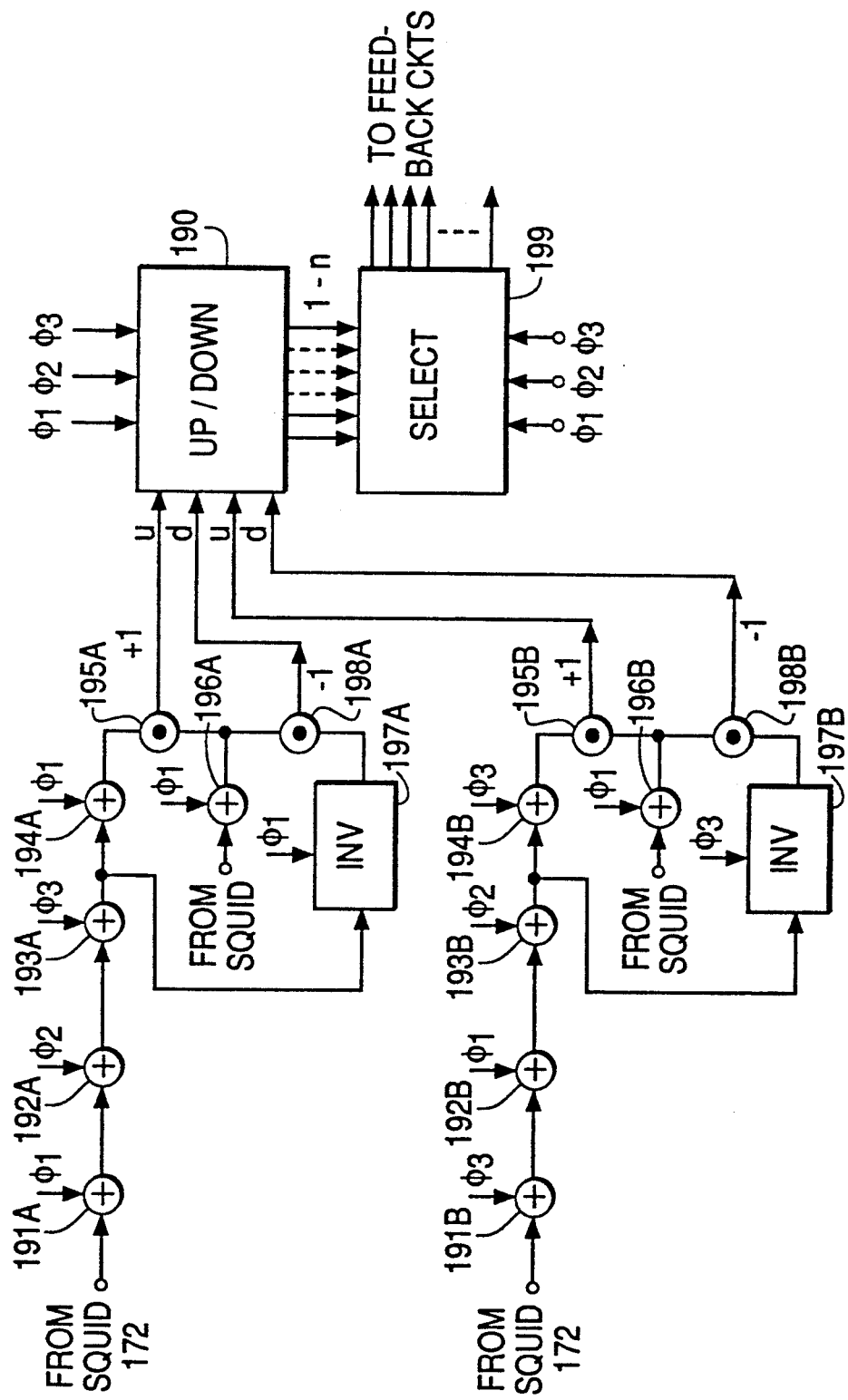
FIG. 25 is a block diagram showing the construction of a control part of the embodiment of FIG. 23.

FIG. 25 shows a construction for realizing the SQUID magnetometer of FIG. 23.

In this construction, the magnitude of the unit feedback flux $\Delta\Phi$ is controlled such that the magnitude is increased when positive output pulses or negative output pulses are outputted successively from the SQUID sensor 172. It should be noted that successive output of output pulses having the same polarity indicates that the magnitude of the magnetic flux $\Phi_x$ is substantially larger than the feedback magnetic flux. Thus, the foregoing control to increase the unit feedback flux accelerates the cancelling out of the incident magnetic flux I and hence the response of the SQUID magnetometer. On the other hand, when an output pulse of the SQUID sensor 172 of a first polarity is followed by a next output pulse of an opposing polarity, this means that the incident magnetic flux $\Phi_x$ is more or less canceled by the feedback magnetic flux. In such a case, the system of FIG. 25 decreases the magnitude of the unit feedback flux $\Delta\Phi$ such that the measurement of the magnetic flux is made with increased accuracy.

Referring to FIG. 25, the SQUID magnetometer comprises OR gates 191A, 192A and 193A respectively driven in response to three phase signals $\phi1$, $\phi2$ and $\phi3$. Thereby, the output pulse of the SQUID sensor 172 is supplied to the OR gate 191A and transferred successively to the OR gates 192A and 192B in response to each of the three phase signals. Thereby, the timing of the output signal of the SQUID sensor 72 is delayed by one clock period. The output signal thus delayed in then supplied to another OR gate 194A that is driven by the first-phase signal $\phi1$ and the output of the OR gate 194A is supplied further to an AND gate 195A. Further, there is provided another OR gate 196A driven in response to the first-phase signal $\phi1$ that is supplied with the output of the SQUID sensor 172 directly without delay. The output of the OR gate 196A, too, is supplied to the AND gate 195A, and the gate 195A takes the logic product of the output of the OR gate 194A and the output of the OR gate 196A. Further, the output of the OR gate 193A is supplied to a timed inverter 197A driven in response to the first-phase signal $\phi1$ and the output of this timed inverter 197A is supplied to another superconducting AND gate 198A that takes a logic product thereof with the output of the OR gate 196A.

Thus, when there are successive positive output pulses from the SQUID sensor 172, the AND gate 195A produces a high level output and this high level output is supplied to a superconducting up/down counter 190 having a construction similar to the up/down counter 151, as the control signal u having the logic value 1. In this same situation, the output of the AND gate 198A assumes the low level state and this low level signal is supplied to the up/down counter 190 as the signal d ($d=0$) that is conjugate to the signal u. Thereby, the up/down counter 190 increases the count held therein.

On the other hand, when there is given a positive output pulse followed by no positive output pulse from the SQUID sensor 172, the output of the OR gate 196A and hence the output of the AND gate 195A takes a low level state. Further, the output of the AND gate 198A assumes the high level state. Thereby, the control signal u having the logic value 0 and the control signal d having the logic value 1 are supplied to the up/down counter 190.

Further, in order to handle the case where a negative output pulse is supplied from the SQUID sensor 172 followed by negative output pulse or not, another similar logic circuit comprising logic gates 191B-198B is provided in connection with the up/down counter 190. This logic circuit is substantially identical to the logic circuit described above except that the OR gate 191B is driven by the third-phase signal $\phi3$, the OR gate 192B driven by the first-phase signal $\phi1$, the OR gate 193B driven by the second-phase signal $\phi2$, the OR gates 194B, 196B and the timed inverter 197B driven by the third-phase signal $\phi3$. Thereby, the AND gate 195B produces a high level output as the control signal u and the AND gate 198B produces a low level output as the control signal d when two successive negative pulses are outputted from the SQUID sensor 172. In the case that the SQUID sensor 172 produced a negative output pulse followed by a negative output pulse, on the other hand, the output of the AND gate 195B assumes the low level state indicating that $u=0$ and the output of the AND gate 198B assumes the high level state indicating that $d=1$.

In response to the control signals u and d, the up/down counter 190 changes its count, and the value held in each column of the counter is changed in correspondence to the output of the SQUID sensor 172, whether the positive output pulses continue, the negative output pulses continue or not. The each bit of the up/down counter 190 is then supplied to a decoder circuit 199 that selects one of the feedback circuit from a group of feedback circuits in which the magnitude of the feedback magnetic flux per single output pulse of the SQUID sensor 172 is changed in each feedback circuit. The construction of such a decoder circuit is obvious and further description thereof will be omitted. In the simplest case, the up/down counter 190 may be a single-bit counter configured that the selection of the feedback circuit is made in response to the binary digit representing the counted value.

Figure 26:
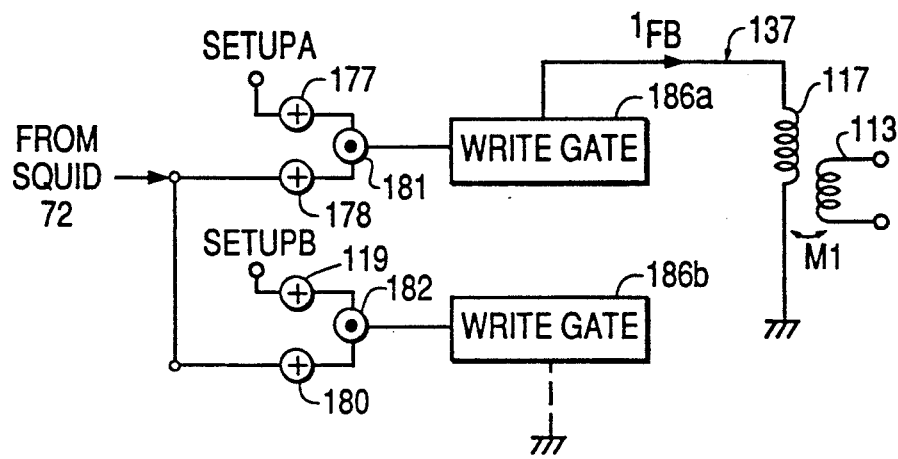
FIG. 26 is a block diagram showing the construction of a fourth embodiment of the present invention.

FIG. 26 shows another example of changing the magnitude of the feedback current in response to the setting signal given by the setup controller 174.

Referring to FIG. 26, the output pulse of the SQUID sensor 172 is supplied to a write gate 186 similar to the write gate 135. In this example, there are provided a plurality of write gates 186a and 186b each having an identical construction. In this construction, the number of the write gates that are coupled to the flux storage loop 137 is changed in response to the setting signal supplied to the OR gates 177 and 179. Thereby, the feedback current IFB becomes a sum of the feedback currents that are produced by the respective write gates coupled to the flux storage loop 137. Thus by changing the number of the write gates 186a and 186b that are connected to the flux storage loop 137 by the setup control signal, one can change the slew rate of feedback current and thus the response of the SQUID magnetometer.

Figure 27:
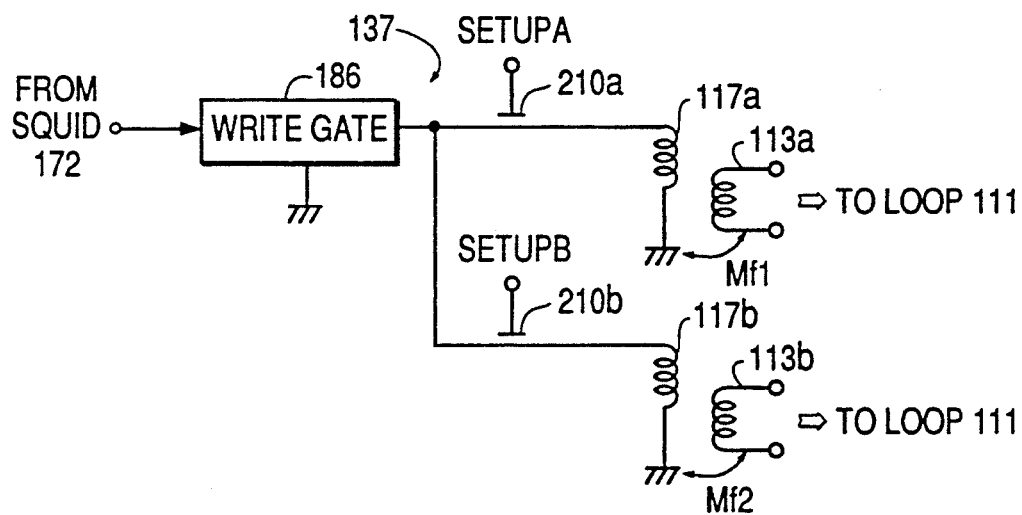
FIG. 27 is a block diagram showing the construction of a fifth embodiment of the present invention.

FIG. 27 shows another possible construction for implementing the present embodiment, wherein there are provided a plurality of coupling windings 117a and 117b in stead of providing a single winding 117, respectively in magnetic coupling with corresponding windings 113a and 113b that are connected to the pickup coil 111.

Referring to FIG. 27, the output of the SQUID sensor 172 is supplied to the write gate 186 and the write gate supplies the feedback current selectively to one of the coupling windings 117a and 117b. The mutual inductance between the winding 117a and the corresponding winding 113a is set to be different from the mutual inductance between the winding 117b and the corresponding winding 113b, and thus one can change the magnitude of the counteracting magnetic field induced in the pickup coil 111 by selecting one of the windings 117a and 117b. Thereby, the stepwise increment or decrement of the counteracting magnetic field per one output pulse of the SQUID sensor 172 is changed and the response of the SQUID magnetometer is set as desired.

The selection of the winding is made by a tree-terminal superconducting devices 210a and 210b that are provided in the vicinity of the superconducting lead extending from the write gate 186 to the superconducting windings 117a and 117b for breaking the superconduction state of the superconducting lead upon application of a control voltage. Such a device is described in Nishino et al. (Nishino, T. et al. "Three-terminal Superconducting Device using a Si Single-crystal Film," IEEE Electron Device Lett., EDL-6, pp 297-299, 1985) which is incorporated as reference. The devices 210a and 210b are selectively energized by the setting signal from the setup controller 174 and in response to this, one of the mutual conductance, Mf1 or Mf2, is selected. Thereby, the response of the SQUID magnetometer is changed as desired.

Figure 28:
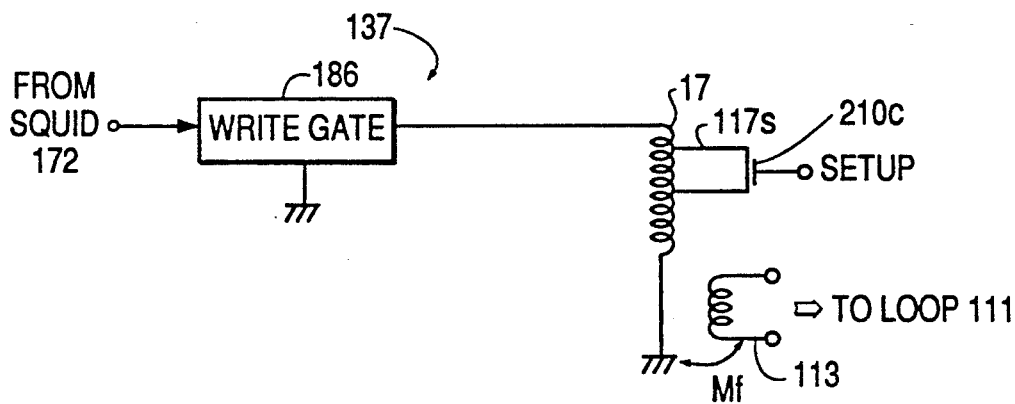
FIG. 28 is a block diagram showing the construction of a sixth embodiment of the present invention.

FIG. 28 shows a modification of the construction of FIG. 27 wherein the value of inductance of the superconducting winding 117 is changed by providing a superconducting shunt path 117s and breaking the superconductivity of the shunt path 117s selectively by a three terminal superconducting device 210c that is a device similar to the devices 210a and 210b. In this construction, too, one can change the response of the SQUID magnetometer by changing the magnitude of the counteracting magnetic field unit induced in the pickup coil 111.

Further, the present invention is not limited to those embodiments described heretofore, but various variations and modifications may be made without departing from the scope of the invention.

What is claimed is:

1. A superconducting quantum interference magnetometer for measuring an unknown magnetic flux, comprising:
    a superconducting pickup coil of a superconducting body forming a closed loop, said superconducting pickup coil being provided for interlinking with an unknown magnetic flux and causing to flow an induction current in response to the interlinking with the unknown magnetic flux;
    superconducting detection means, comprising a superconducting quantum interference device and coupled magnetically with the superconducting pickup coil, for producing output voltage pulses in response to the interlinking of the unknown magnetic flux with the superconducting pickup coil;
    superconducting feedback means connected to the superconducting detection means for receiving the output voltage pulses therefrom, said feedback means being further coupled magnetically to the superconducting pickup coil for feeding back a feedback magnetic flux to the superconducting pickup coil in response to each output voltage pulse of the superconducting detection means such that the feedback magnetic flux counteracts the unknown magnetic flux that interlinks with the superconducting pickup coil, said superconducting feedback means producing the feedback magnetic flux with a magnitude corresponding to the number of pulses produced by the superconducting detection means, said superconducting feedback means further having resetting means supplied with a reset signal for deenergizing the feedback magnetic flux in response to the reset signal;
    resistance means provided in the vicinity of said superconducting pickup coil, said resistance means being supplied with a drive current for causing a transition in a part of the superconducting body forming the superconducting pickup coil from a superconduction state to a normal conduction state in response to the drive current; and
    control means connected to the resistance means and the resetting means of the superconducting feedback means, said control means being connected further to the superconducting detection means for receiving the output pulses therefrom and producing the reset pulse and the drive current in response to the output pulse of superconducting detection means.

2. A superconducting quantum interference magnetometer as claimed in claim 1 further comprising an insulator layer, disposed between said superconducting body and said resistance means, having a thickness sufficient to cause a minimum parasitic magnetic flux induced when the drive current is supplied.

3. A superconducting quantum interference magnetometer as claimed in claim 1 in which said resistance means comprises a plurality of resistance strips connected with each other to minimize the formation of the parasitic magnetic flux when the drive current is supplied.

4. A superconducting quantum interference magnetometer as claimed in claim 1 in which said feedback means comprises a superconducting feedback loop of a superconducting pickup coil and said resetting means comprises a resistance heater supplied with a drive current in response to the reset signal, wherein said resistance heater is provided in the vicinity of a part of the superconducting feedback loop for causing a transition in the superconducting body forming said part from the superconduction state to the normal conduction state in response to the reset signal.

5. A superconducting quantum interference magnetometer as claimed in claim 4 further comprising an insulator layer, disposed between said part of the superconducting feedback loop and said resistance heater, having a thickness sufficient to cause a minimum parasitic magnetic field induced when the drive current is supplied in response to the reset signal.

6. A superconducting quantum interference magnetometer as claimed in claim 1 in which said feedback means comprises an up/down counter supplied with the output pulse of the superconducting detection means for counting the number of output pulses and producing an output data indicative of the number of output pulses thus counted up such that the number of the counted output pulses increases or decreases in response to the polarity of the output voltage pulses, a digital-to-analog converter supplied with said output data from the up/down counter for converting the same to an analog feedback signal, and a superconducting winding supplied with said analog feedback signal and coupled magnetically to the superconducting pickup coil for inducing the feedback magnetic flux in response to the analog feedback signal, wherein said resetting means is provided in said up/down counter for clearing the number of output pulses thus counted up by the up/down counter, in response to the reset signal.

7. A superconducting quantum interference magnetometer as claimed in claim 1 in which said control means supplies said reset pulse and the drive current when the number of output pulses from the superconducting detection means has reached a predetermined threshold.

8. A superconducting quantum interference magnetometer as claimed in claim 1 in which said superconducting quantum interference magnetometer further comprises selection means connected to the feedback means for changing an increment of the feedback magnetic flux per single output voltage pulse.

9. A superconducting quantum interference magnetometer as claimed in claim 8 in which said selection means comprises a control circuit supplied with the output voltage pulses of the superconduction detection means for changing the increment of the feedback magnetic flux in response to the output voltage pulses supplied thereto.

* * * * *

UNITED STATES PATENT AND TRADEMARK OFFICE
CERTIFICATE OF CORRECTION

PATENT NO. : 5,162,731
DATED : November 10, 1992
INVENTOR(S) : NORIO FUJIMAKI It is certified that error appears in the above-identified patent and that said Letters Patent is hereby corrected as shown below:

On title page, item [54], and col. 1, line 2, change "MAGNOTOMETER" to --MAGNETOMETER--.

Col. 21, line 50, change "in" to --is--

Col. 23, line 12, change "in stead" to --instead--

Signed and Sealed this

Eighteenth Day of January, 1994

Attest:

BRUCE LEHMAN

*Attesting Officer*    *Commissioner of Patents and Trademarks*